(12) United States Patent
Yamada et al.

(10) Patent No.: US 11,272,627 B2
(45) Date of Patent: Mar. 8, 2022

(54) ELECTRONIC DEVICE AND STAND

(71) Applicant: Panasonic Intellectual Property Management Co., Ltd., Osaka (JP)

(72) Inventors: Genichi Yamada, Osaka (JP); Yohei Kodera, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/461,198

(22) PCT Filed: Nov. 15, 2017

(86) PCT No.: PCT/JP2017/041015
§ 371 (c)(1),
(2) Date: May 15, 2019

(87) PCT Pub. No.: WO2018/096990
PCT Pub. Date: May 31, 2018

(65) Prior Publication Data
US 2019/0313541 A1 Oct. 10, 2019

(30) Foreign Application Priority Data
Nov. 28, 2016 (JP) .............................. JP2016-230506

(51) Int. Cl.
*H05K 5/02* (2006.01)
*H05K 5/00* (2006.01)
(Continued)

(52) U.S. Cl.
CPC ............ *H05K 5/0234* (2013.01); *B60R 11/02* (2013.01); *F16M 13/022* (2013.01);
(Continued)

(58) Field of Classification Search
CPC .. H05K 5/0234; H05K 5/0017; H05K 5/0208; H05K 5/023; H04N 5/64;
(Continued)

(56) References Cited

U.S. PATENT DOCUMENTS 3,514,065 A * 5/1970 Donaldson .............. F16B 47/00
248/363
4,760,987 A * 8/1988 Lan ......................... A47G 23/03
248/346.11
(Continued)

FOREIGN PATENT DOCUMENTS

CN 202484557 U 10/2012
CN 204279265 U 4/2015
(Continued)

OTHER PUBLICATIONS

The Extended European Search Report dated Oct. 16, 2019 for the related European Patent Application No. 17873664.1.
(Continued)

Primary Examiner — Rockshana D Chowdhury
Assistant Examiner — Douglas R Burtner
(74) Attorney, Agent, or Firm — McDermott Will and Emery LLP

(57) ABSTRACT

An electronic device includes a device main body and a stand that is placed on a sucked surface and supports the device main body. The stand includes a base portion and an elastic body that is disposed on a lower surface of the base portion and has a suction surface that is attached by suction to the sucked surface with negative pressure generated in a gap between the suction surface and the sucked surface. The elastic body generates no negative pressure in the gap when no external force is exerted on the stand in a direction to separate from the sucked surface while the stand is placed on the sucked surface. The elastic body generates negative
(Continued)

pressure in the gap by being elastically deformed in the direction to separate from the sucked surface when the external force is exerted on the stand while the stand is placed on the sucked surface.

13 Claims, 19 Drawing Sheets

(51) Int. Cl.
| | |
|---|---|
| *H04N 5/64* | (2006.01) |
| *G06F 1/16* | (2006.01) |
| *G09F 9/00* | (2006.01) |
| *B60R 11/02* | (2006.01) |
| *F16M 13/02* | (2006.01) |
| *G02F 1/1333* | (2006.01) |
| *B60R 11/00* | (2006.01) |

(52) U.S. Cl.
CPC .............. *G06F 1/1626* (2013.01); *G09F 9/00* (2013.01); *H04N 5/64* (2013.01); *H05K 5/0017* (2013.01); *H05K 5/023* (2013.01); *H05K 5/0208* (2013.01); *B60R 2011/0056* (2013.01); *F16M 2200/08* (2013.01); *G02F 1/133308* (2013.01)

(58) Field of Classification Search
CPC ......... G06F 1/1626; G09F 9/00; B60R 11/02; B60R 2011/0056; F16M 13/022; F16M 2200/08; G02F 1/133308
See application file for complete search history.

(56) References Cited

U.S. PATENT DOCUMENTS

| | | | | |
|---|---|---|---|---|
| 6,663,064 B1* | 12/2003 | Minelli | ................ | B60R 11/00 248/187.1 |
| 7,913,962 B2* | 3/2011 | Takahashi | ............... | F16B 47/00 248/205.5 |
| 7,975,971 B2* | 7/2011 | Carnevali | ............... | F16B 47/00 248/205.5 |
| 8,087,625 B2* | 1/2012 | Chang | ................. | F16M 13/022 248/205.5 |
| 8,096,537 B2* | 1/2012 | Browne | ................. | F16B 47/00 269/21 |
| 8,191,839 B2* | 6/2012 | Fan | ....................... | F16B 47/006 248/205.5 |
| 8,681,492 B2* | 3/2014 | Fan | ........................ | F16B 47/00 361/679.58 |
| 9,410,571 B2* | 8/2016 | Yang | ....................... | F16B 47/00 |
| 9,422,970 B1* | 8/2016 | Fan | ........................ | A47K 10/12 |
| 9,732,785 B2* | 8/2017 | Kobayashi | ............ | F16B 47/006 |
| 10,364,936 B2* | 7/2019 | Lan | ......................... | F16B 47/00 |
| 10,393,117 B2* | 8/2019 | Ogata | ...................... | F04C 23/02 |
| 11,019,910 B2* | 6/2021 | Walton | .................... | F16M 11/28 |
| 11,137,017 B2* | 10/2021 | Koop | ...................... | F16M 13/00 |
| 2006/0176655 A1* | 8/2006 | Hillman | ............. | F16M 11/2078 361/679.06 |
| 2006/0255218 A1* | 11/2006 | Hsiung | ................... | B60R 11/02 248/160 |
| 2007/0215766 A1* | 9/2007 | Yen | ......................... | F16B 47/00 248/205.8 |
| 2009/0050758 A1* | 2/2009 | Carnevali | ............... | F16B 47/00 248/205.8 |
| 2009/0242719 A1* | 10/2009 | Carnevali | ............... | F16B 47/00 248/346.2 |
| 2009/0242721 A1* | 10/2009 | Carnevali | ................. | A45F 5/00 248/363 |
| 2011/0127395 A1* | 6/2011 | Ostendarp | ............. | F16B 47/006 248/205.8 |
| 2012/0043439 A1* | 2/2012 | Liao | ........................ | F16B 47/00 248/205.8 |
| 2012/0287560 A1* | 11/2012 | Fan | ....................... | H05K 5/0204 361/679.01 |
| 2015/0070839 A1* | 3/2015 | Johnson | .................. | B60R 11/00 361/679.56 |
| 2016/0025264 A1* | 1/2016 | Casagrande | ........... | F16M 13/00 248/205.9 |
| 2016/0258473 A1* | 9/2016 | Koop | .................... | F16M 13/022 |
| 2017/0003711 A1* | 1/2017 | Rowley | .................... | G06F 1/166 |
| 2019/0017536 A1* | 1/2019 | White | ....................... | F16B 47/00 |
| 2019/0249709 A1* | 8/2019 | Smith | ....................... | F16B 47/00 |
| 2020/0237078 A1* | 7/2020 | Walton | .................. | F16B 47/006 |
| 2021/0301973 A1* | 9/2021 | Casagrande | ............ | B60R 11/02 |

FOREIGN PATENT DOCUMENTS

| | | |
|---|---|---|
| CN | 105045345 A | 11/2015 |
| JP | 2007-156176 | 6/2007 |
| JP | 2011-034308 | 2/2011 |
| JP | 2014-099068 | 5/2014 |

OTHER PUBLICATIONS

International Search Report of PCT application No. PCT/JP2017/041015 dated Feb. 20, 2018.

* cited by examiner

FIG. 19
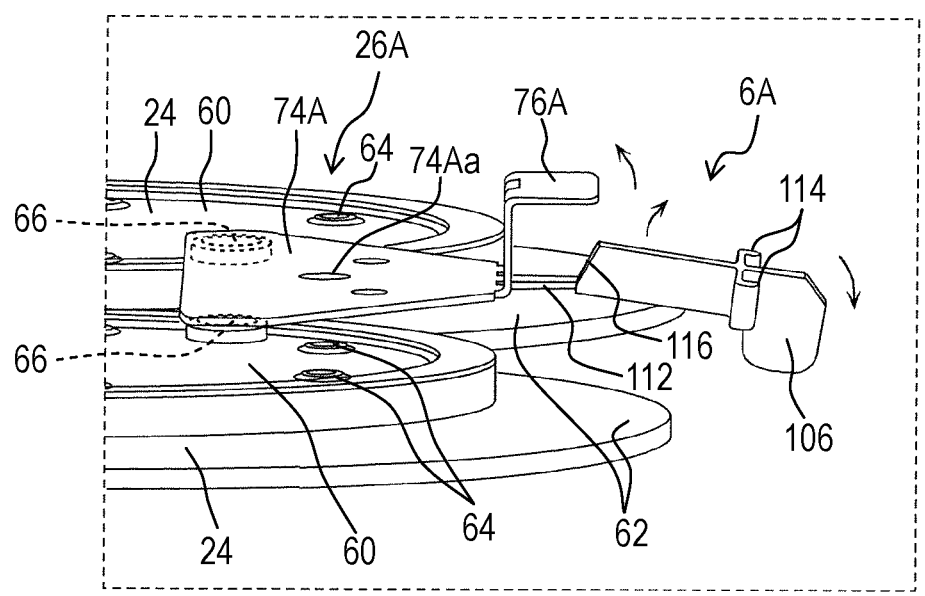
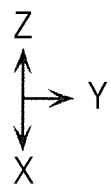

ELECTRONIC DEVICE AND STAND

CROSS-REFERENCE TO RELATED APPLICATIONS

This application is a U.S. national stage application of the PCT International Application No. PCT/JP2017/041015 filed on Nov. 15, 2017, which claims the benefit of foreign priority of Japanese patent application No. 2016-230506 filed on Nov. 28, 2016, the contents all of which are incorporated herein by reference.

TECHNICAL FIELD

The present disclosure relates to an electronic device including a stand.

BACKGROUND ART

An example of an electronic device including a stand is a display device such as a liquid crystal television receiver. PTL 1 discloses a display device including a stand. The stand supports a panel-shaped display unit that has a display screen. The stand includes a plate-shaped pedestal and a support extending upward from the pedestal. The pedestal is placed on a location on which the display device is placed, such as a mount table (for example, a television table). An upper end portion of the support is fixed to a back surface of the display unit with screws and the like.

CITATION LIST

Patent Literature

PTL 1: Unexamined Japanese Patent Publication No. 2007-156176

SUMMARY

The present disclosure provides an electronic device and a stand that can effectively prevent falling down with a simple configuration.

An electronic device according to the present disclosure includes a device main body, and a stand that is placed on a sucked surface and supports the device main body. The stand includes a base portion, and an elastic body that is disposed on a lower surface of the base portion and has a suction surface that is attached by suction to the sucked surface with negative pressure generated in a gap between the suction surface and the sucked surface. The elastic body generates no negative pressure in the gap when no external force is exerted on the stand in a direction to separate from the sucked surface while the stand is placed on the sucked surface. The elastic body generates negative pressure in the gap by being elastically deformed in the direction to separate from the sucked surface when the external force is exerted on the stand while the stand is placed on the sucked surface.

A stand according to the present disclosure is a stand that is placed on a sucked surface and supports a device main body. The stand includes a base portion and an elastic body that is disposed on a lower surface of the base portion and has a suction surface that is attached by suction to the sucked surface with negative pressure generated in a gap between the suction surface and the sucked surface. The elastic body generates no negative pressure in the gap when no external force is exerted on the stand in a direction to separate from the sucked surface while the stand is placed on the sucked surface. The elastic body generates negative pressure in the gap by being elastically deformed in the direction to separate from the sucked surface when the external force is exerted on the stand while the stand is placed on the sucked surface.

An electronic device and a stand according to the present disclosure can effectively suppress falling down of the electronic device with a simple configuration.

BRIEF DESCRIPTION OF DRAWINGS

FIG. 19 is a view for describing an operation of the stand according to the second exemplary embodiment.

Figure 1:
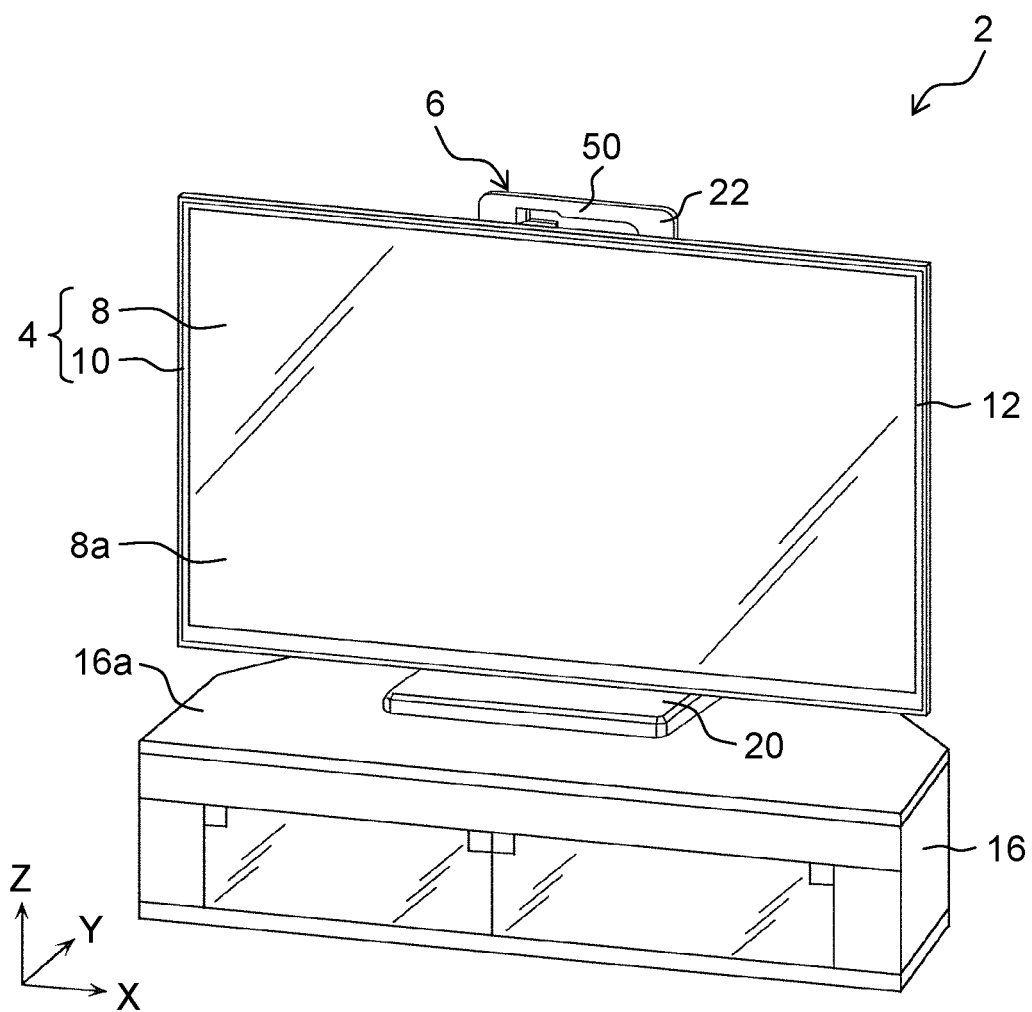
FIG. 1 is a perspective view schematically showing an example of an external appearance of a front surface side of an electronic device according to a first exemplary embodiment.

DESCRIPTION OF EMBODIMENTS (Knowledge Underlying the Present Disclosure)

The inventors of the present application have found the following problems in the technique disclosed in PTL 1.

Conceivable examples of measures for preventing the liquid crystal television receiver disclosed in PTL 1 from falling down due to an external force such as earthquake shaking include a) increasing a contact area between the pedestal of the stand and the mount table (to be referred to as "measure A" hereinafter), b) fixing the pedestal of the stand to the mount table with a fixing belt (to be referred to as "measure B" hereinafter), and c) attaching by suction a suction cup mounted on the pedestal of the stand to the mount table (to be referred to as "measure C" hereinafter).

However, measure A has difficulty in achieving space saving of an installation location of the pedestal because of an increase in planar size of the pedestal of the stand. Measure B imposes a cumbersome procedure on a user because the user needs to manually fix the pedestal of the stand to the mount table with the fixing belt when placing the liquid crystal television receiver and manually unfasten the fixing belt when moving the liquid crystal television receiver.

When measure C is employed, while the pedestal of the stand is placed on the mount table, the suction cup is always attached by suction to the mount table. The suction cup is attached by suction to the mount table with negative pressure generated in a gap between the suction cup and the mount table by elastic deformation of the suction cup. At this time, an elastic restoring force that restores the suction cup to its original shape always acts as a load. This tends to degrade the suction cup, resulting in difficulty in maintaining suction force for a long period of time.

Exemplary embodiments are described in detail below with reference to the drawings as appropriate. However, unnecessarily detailed descriptions may be omitted. For example, a detailed description of well-known matters, and a duplicate description of substantially identical structures may not be provided. This is to avoid unnecessary redundancy in the following description and to facilitate understanding of those skilled in the art.

The accompanying drawings and the following exemplary embodiments are provided for those skilled in the art to fully understand the present disclosure, and merely illustrate an example of the present disclosure. Numerical values, shapes, materials, constituent elements, arrangement positions and connection modes of the constituent elements, and the like described in the following exemplary embodiments are merely examples, and therefore are not intended to limit the subject matters of the claims. Also, of the constituent elements in the following exemplary embodiments, constituent elements not recited in the independent claim indicating the broadest concept may be optionally added to the constituent elements described in the independent claim.

Furthermore, the drawings are not necessarily accurate illustrations, but are schematic views simplified as appropriate for ease of understanding of the present disclosure. In the drawings, the same reference numerals are assigned to substantially the same constituent elements, and a duplicate description of such constituent elements may be omitted or simplified.

Note that three axes, i.e., an X-axis, a Y-axis, and a Z-axis, are shown in the drawings, and the X, Y, and Z axes are used as required to describe the following exemplary embodiments. In this exemplary embodiment, for the sake of convenience, a direction parallel (substantially parallel) to long sides of liquid crystal display panel 8 of electronic device 2 placed on a mount table 16 is defined as an X-axis direction, a direction parallel (substantially parallel) to short sides of liquid crystal display panel 8 is defined as a Z-axis direction, and a direction orthogonal to both the X-axis and the Z-axis is defined as a Y-axis direction. In electronic device 2, a side relatively farther from mount table 16 is defined as a "top", a side relatively closer to mount table 16 is defined as a "bottom", and a direction from the bottom to the top is defined as a positive Z-axis direction. An obverse surface (a surface on which images are displayed) of liquid crystal display panel 8 is defined as a front surface or front, a direction from the obverse surface of liquid crystal display panel 8 to its back surface is defined as a position Y-axis direction, and a direction from left to right relative to the front surface of liquid crystal display panel 8 is defined as a positive X-axis direction. Assume that mount table 16 is placed on a surface substantially parallel to a horizontal plane (X-Y plane). These directions, however, are relative directions illustrated for the sake of convenience, and are not absolute directions. The present disclosure is not limited to these directions.

First Exemplary Embodiment

A first exemplary embodiment will be described below with reference to FIGS. 1 to 11.

[1-1. General Configuration of Electronic Device]

A general configuration of electronic device 2 according to the first exemplary embodiment will be described with reference to FIGS. 1 and 2.

FIG. 1 is a perspective view schematically showing an example of an external appearance of the front surface side of electronic device 2 according to the first exemplary embodiment.

Figure 2:
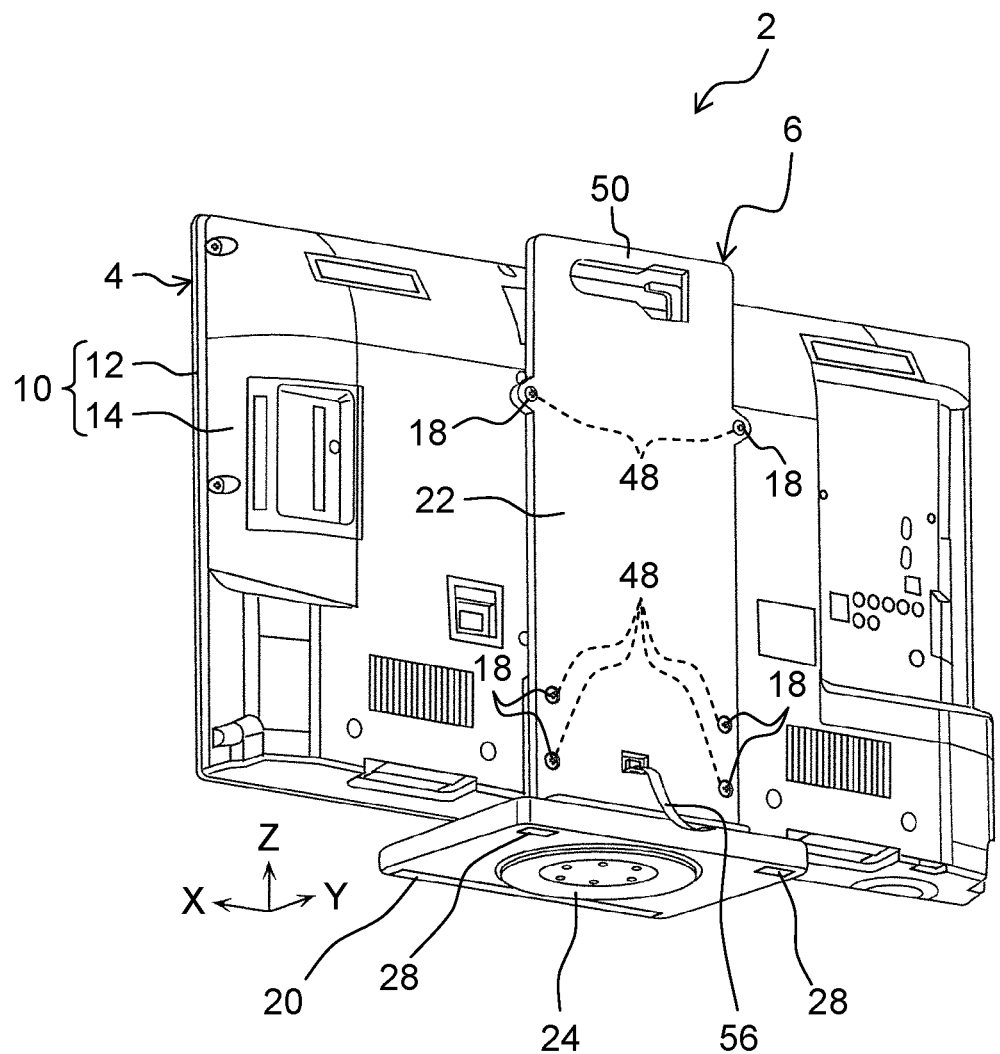
FIG. 2 is a perspective view schematically showing an example of a configuration of a back surface side of the electronic device according to the first exemplary embodiment.

FIG. 2 is a perspective view schematically showing an example of a configuration of the back surface side of electronic device 2 according to the first exemplary embodiment.

As shown in FIGS. 1 and 2, electronic device 2 includes device main body 4 and stand 6. Device main body 4 is a panel-shaped display unit, and is, for example, a flat panel display type liquid crystal television receiver.

Device main body 4 includes liquid crystal display panel 8 and housing 10.

Liquid crystal display panel 8 is disposed in housing 10. Display screen 8a for displaying images is formed on the front surface of liquid crystal display panel 8.

Housing 10 includes front cabinet 12 and rear cabinet 14. Front cabinet 12 is formed into a rectangular frame shape when viewed from the Y-axis direction, and is disposed to cover an outer peripheral portion of liquid crystal display panel 8. Rear cabinet 14 is disposed to cover a back surface of liquid crystal display panel 8 (a surface on an opposite surface to display screen 8a or a surface on a positive Y-axis direction side), and is coupled to front cabinet 12.

Stand 6 is a member for supporting device main body 4. As shown in FIG. 2, stand 6 is mounted on rear cabinet 14 with a plurality of screws 18. Although a placement location of stand 6 is not specifically limited and may be placed on any location, the placement location of stand 6 is preferably a surface substantially parallel to a horizontal plane (X-Y plane). This exemplary embodiment will exemplify a case in which stand 6 is placed on sucked surface 16a formed on an upper surface (a surface on a positive Z-axis direction side) of mount table 16 (for example, a television table) as shown in FIG. 1.

Note that electronic device 2 according to this exemplary embodiment features a configuration of stand 6, and device main body 4 may be a general liquid crystal television receiver. Accordingly, a description of device main body 4 will be omitted, and the configuration of stand 6 will be described below.

[1-2. Configuration of Stand]

[1-2-1. General Configuration of Stand]

A general configuration of stand 6 according to the first exemplary embodiment will be described next with reference to FIGS. 2 to 4.

Figure 3:
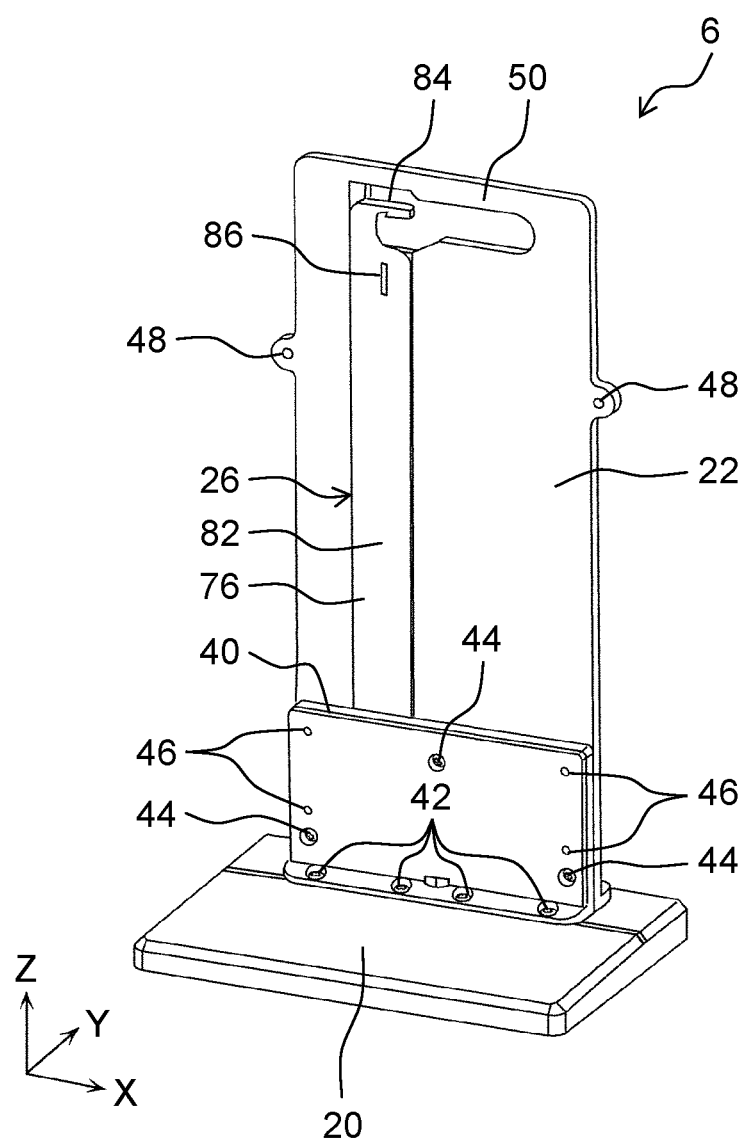
FIG. 3 is a perspective view schematically showing an example of a configuration of a front surface side of a stand according to the first exemplary embodiment.

FIG. 3 is a perspective view schematically showing an example of a configuration of a front surface side of stand 6 according to the first exemplary embodiment.

Figure 4:
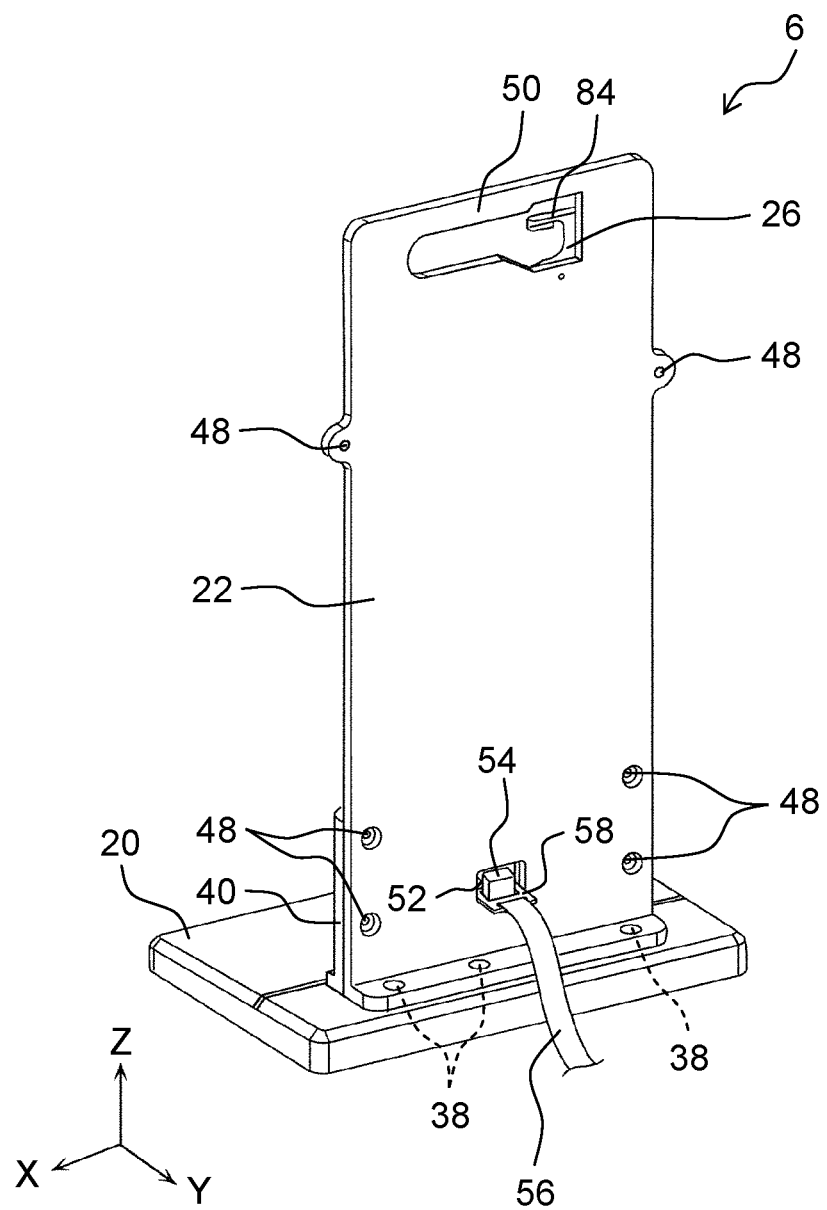
FIG. 4 is a perspective view schematically showing an example of a configuration of a back surface side of the stand according to the first exemplary embodiment.

FIG. 4 is a perspective view schematically showing an example of configuration of a rear surface side of stand 6 according to the first exemplary embodiment.

As shown in FIGS. 2 to 4, stand 6 includes base portion 20, support portion 22, elastic body 24, and valve mechanism 26. Each constituent element of stand 6 will be described below.

[1-2-2. Base Portion]

Base portion 20 will be described first with reference to FIGS. 3 to 6A and 7.

Figure 5:
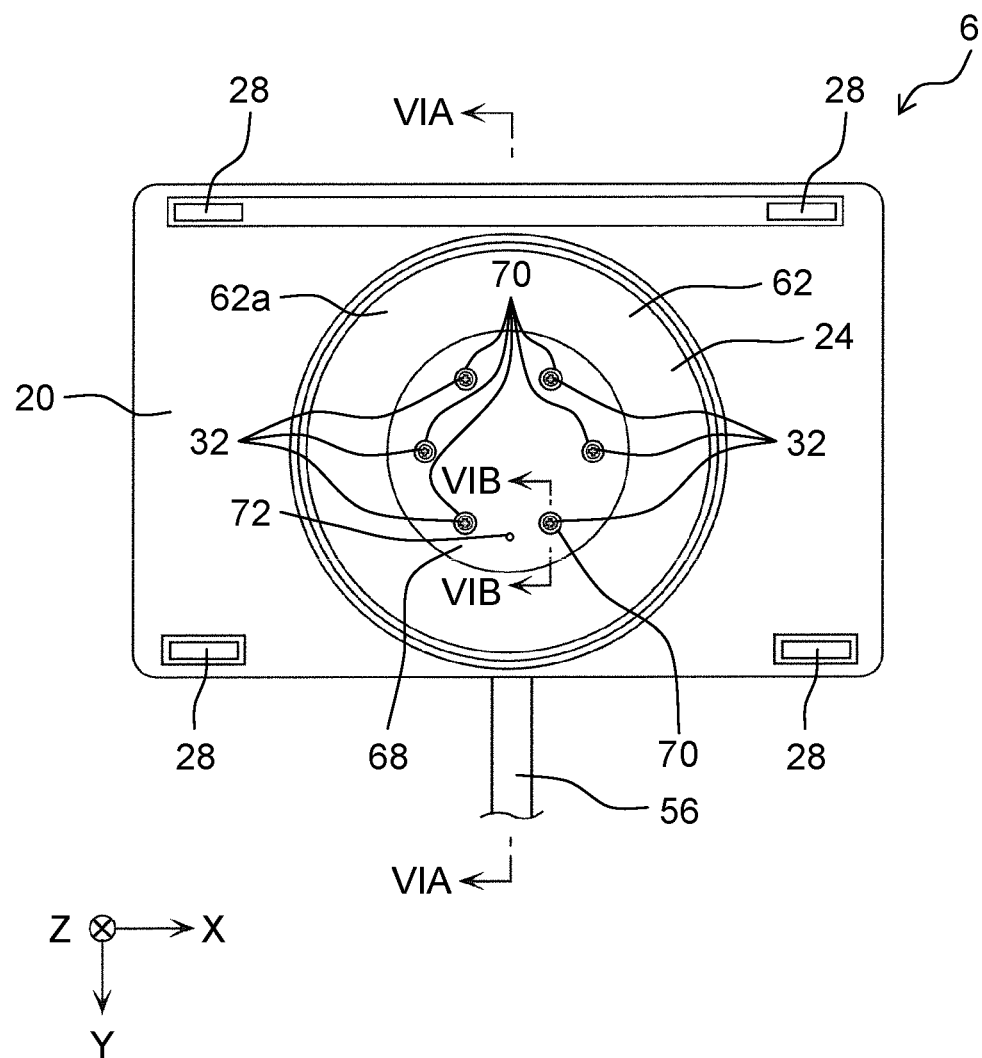
FIG. 5 is a perspective view schematically showing an example of a configuration of a bottom surface side of the stand according to the first exemplary embodiment.

FIG. 5 is a view schematically showing an example of a configuration of a bottom surface of stand 6 according to the first exemplary embodiment.

Figure 6A:
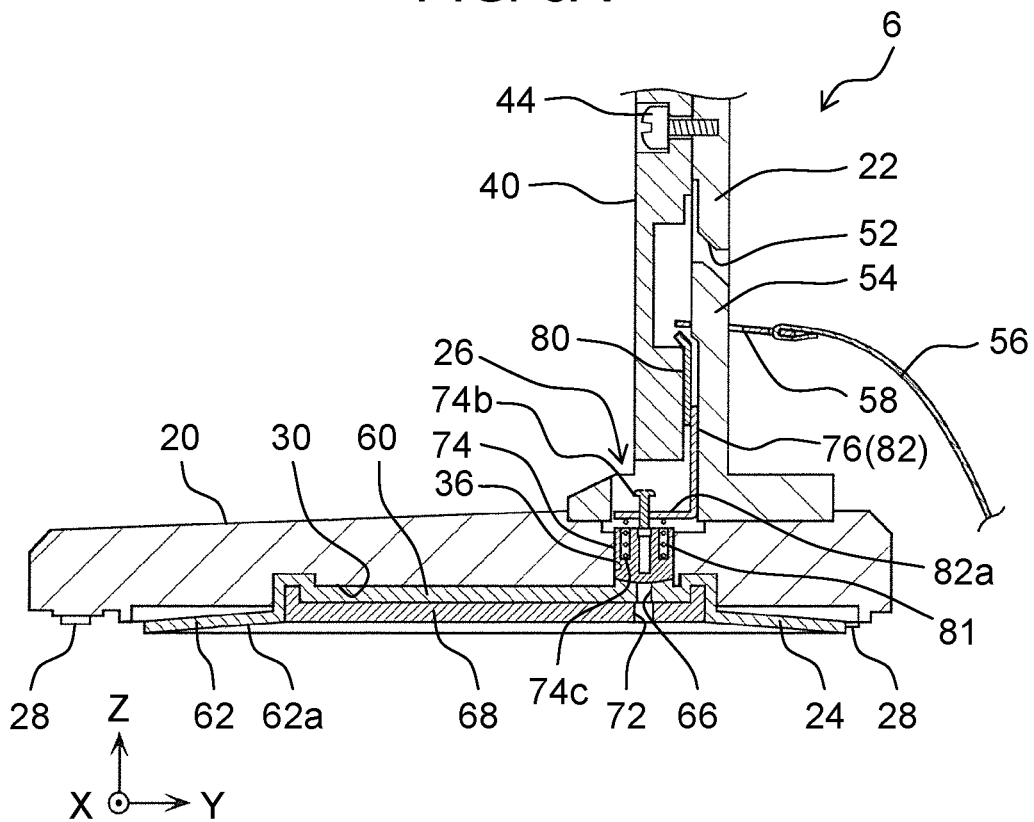
FIG. 6A is a sectional view schematically showing an example of an internal structure of the stand according to the first exemplary embodiment.

FIG. 6A is a sectional view schematically showing an example of an internal structure of stand 6 according to the first exemplary embodiment. FIG. 6A is a sectional view taken along line VIA-VIA in FIG. 5.

Figure 7:
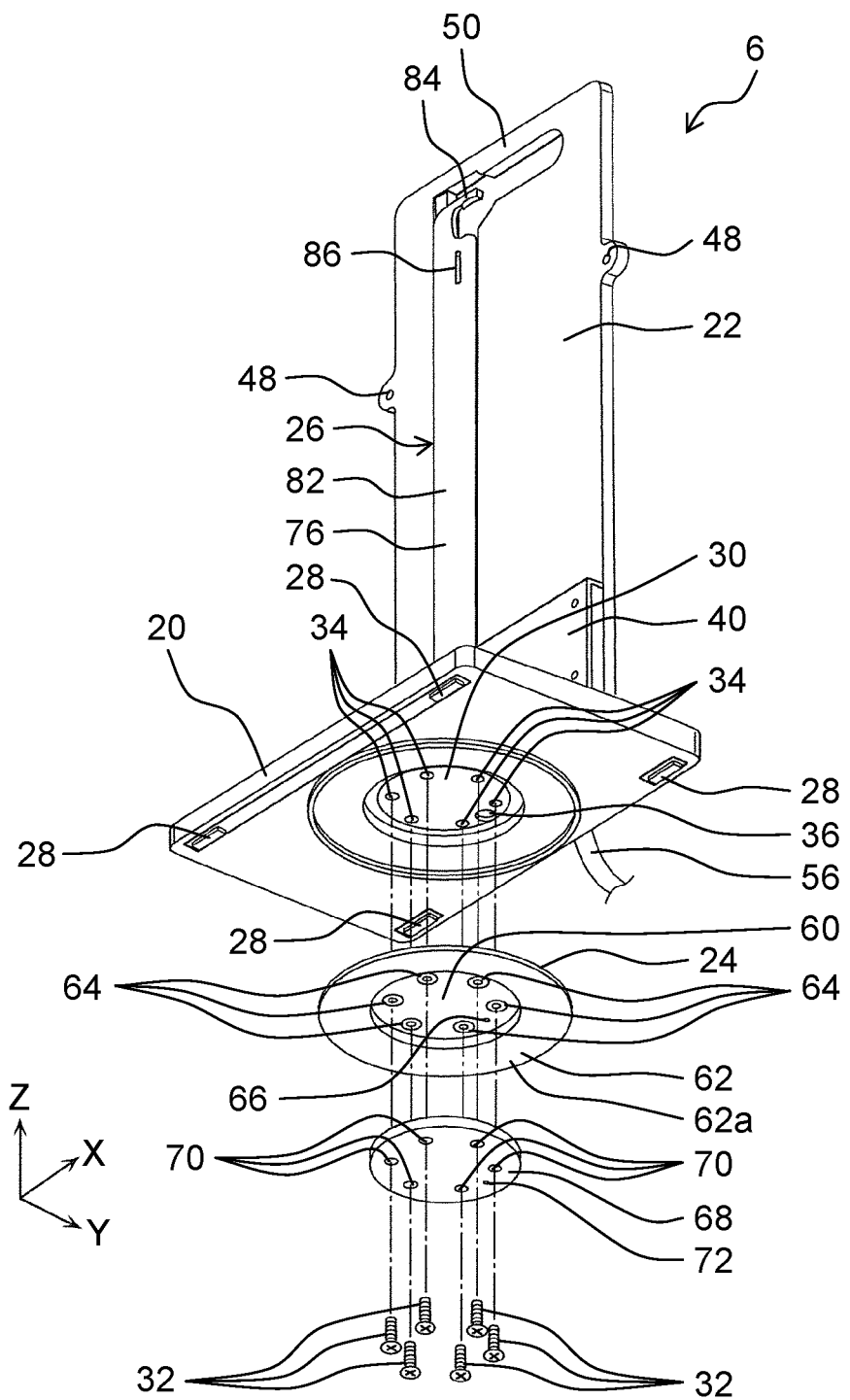
FIG. 7 is an exploded perspective view schematically showing an example of a structure of the stand according to the first exemplary embodiment.

FIG. 7 is an exploded perspective view schematically showing an example of the structure of stand 6 according to the first exemplary embodiment. The perspective view of stand 6 in FIG. 7 shows an exploded view of part of base portion 20.

Base portion 20 is a base placed on sucked surface 16a (see FIG. 1). Base portion 20 is formed into a substantially rectangular plate shape in planar view (when viewed from the Z-axis direction), as shown in FIGS. 3 to 5.

As shown in FIGS. 5 to 7, leg portions 28 are respectively formed on four corners of a lower surface (a bottom surface or a surface on a negative Z-axis direction side) of base portion 20. That is, base portion 20 includes a plurality of (for example, four) leg portions 28 on the lower surface. Leg portions 28 are provided to protrude downward (in the negative Z-axis direction) from the lower surface of base portion 20. Each of the plurality of leg portions 28 comes into contact with sucked surface 16a when base portion 20 is placed on sucked surface 16a. Accordingly, leg portions 28 form a gap between the lower surface of base portion 20 and sucked surface 16a.

As shown in FIGS. 6A and 7, recess portion 30 recessed in the positive Z-axis direction is formed in the lower surface of base portion 20 so as to accommodate elastic body 24. Recess portion 30 is formed into a circular shape in planar view (when viewed from the negative Z-axis direction). A plurality of screw holes 34 into which screws 32 are screwed are formed in recess portion 30 in the Z-axis direction. The plurality of screw holes 34 are provided at intervals in the circumferential direction of recess portion 30.

As shown in FIGS. 6A and 7, through hole 36 for movably accommodating on-off valve 74 (to be described later) is formed in base portion 20. Through hole 36 extends through base portion 20 in a thickness direction thereof (Z-axis direction) from an upper surface (a surface on a positive Z-axis direction side) of base portion 20 to a lower surface (a surface on a negative Z-axis direction side) of recess portion 30 of base portion 20.

[1-2-3. Support Portion]

Support portion 22 will be described next with reference to FIGS. 2 to 4, 6A, and 8.

Figure 8:
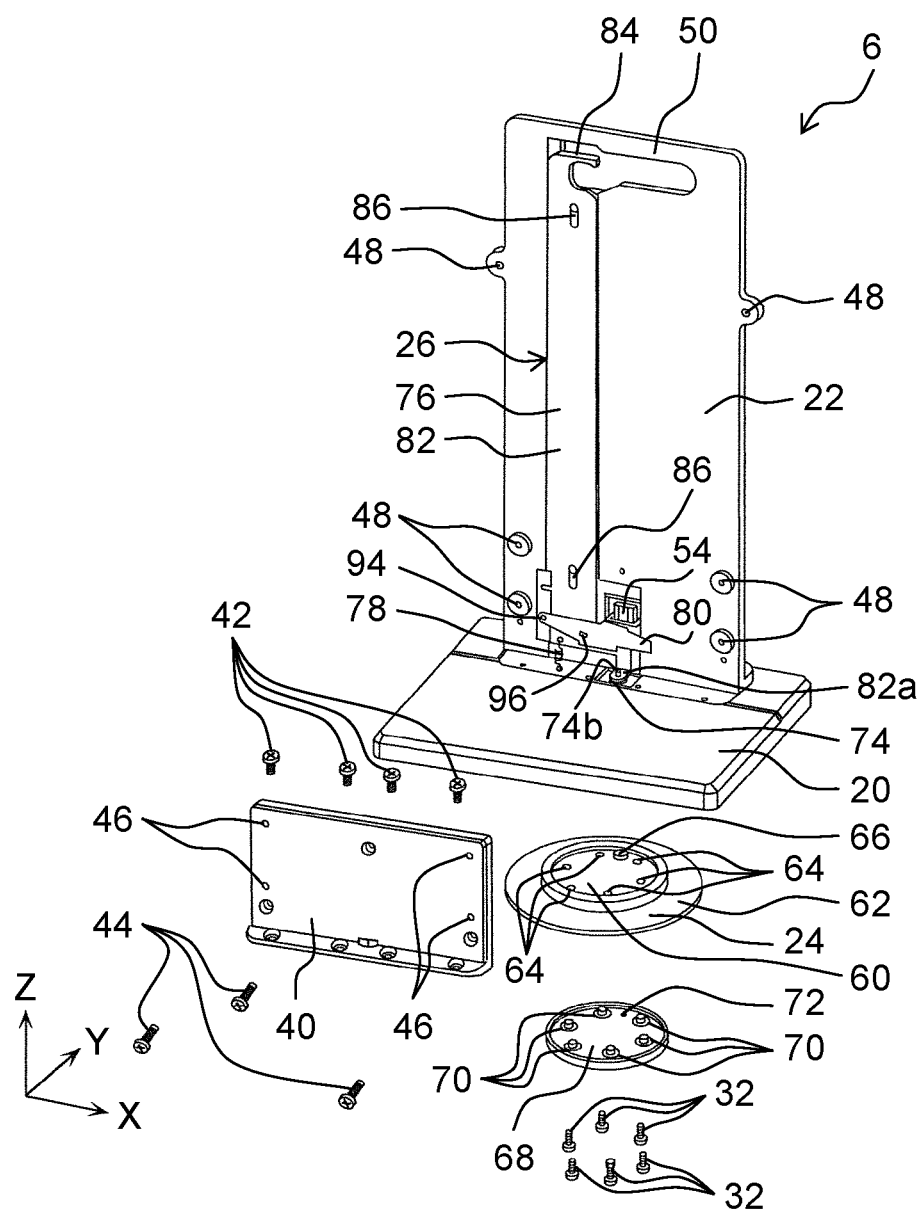
FIG. 8 is an exploded perspective view schematically showing an example of a structure of the stand according to the first exemplary embodiment.

FIG. 8 is an exploded perspective view schematically showing an example of a structure of stand 6 according to the first exemplary embodiment. The perspective view of stand 6 in FIG. 8 shows part of base portion 20 and support cover 40 in an exploded state. Note that FIG. 8 is an exploded perspective view of stand 6 when viewed from an angle different from that in the exploded perspective view shown in FIG. 7 (viewed from the same direction as that in the perspective view shown in FIG. 3).

Support portion 22 is a member for supporting device main body 4. Support portion 22 is provided upright on the upper surface of base portion 20. As shown in FIGS. 2 to 4 and 6A, support portion 22 is formed into a plate shape elongated when viewed from the Y-axis direction (elongated in the Z-axis direction). As shown in FIG. 4, a lower end portion of support portion 22 is mounted on the upper surface of base portion 20 with a plurality of screws 38.

As shown in FIGS. 3, 6A, and 8, support cover 40 is disposed on an inner surface of support portion 22 which is located near its lower end portion (a surface on a device main body 4 side or a surface on the negative Y-axis direction side). Support cover 40 is mounted on the upper surface of base portion 20 with a plurality of screws 42 and is also mounted on the inner surface of support portion 22 with the plurality of screws 44. A plurality of holes 46 are formed in support cover 40 so as to allow the plurality of screws 18 to extend through.

A plurality of holes 48 are formed in an outer peripheral portion of support portion 22 so as to allow the plurality of screws 18 to extend through. As shown in FIG. 2, support portion 22 is mounted on rear cabinet 14, together with support cover 40, by screwing screws 18 into screw holes (not shown) formed in rear cabinet 14 through holes 48 of support portion 22 and holes 46 of support cover 40. This fixes device main body 4 to stand 6.

Handle 50 is formed on an upper end portion of support portion 22. Handle 50 is a portion to be gripped with hand 92 (see FIG. 10) when a user lifts electronic device 2.

As shown in FIGS. 4 and 6A, opening portion 52 is formed in a portion (positive Z-axis direction side) located slightly higher than a lower end portion of support portion 22. Hook portion 54 is formed on a lower end side (negative Z-axis direction side) of a peripheral edge portion of opening portion 52 so as to protrude upward (in the positive Z-axis direction). Buckle 58 connected to one end portion of fixing belt 56 is detachably engaged with hook portion 54. Note that fixing belt 56 is a belt for fixing electronic device 2 to, for example, mount table 16, and is used to assist to prevent electronic device 2 from falling down. The other end portion (not shown) of fixing belt 56 is attached to, for example, mount table 16.

[1-2-4. Elastic Body]

Elastic body 24 will be described next with reference to FIGS. 5 to 8.

Figure 6B:
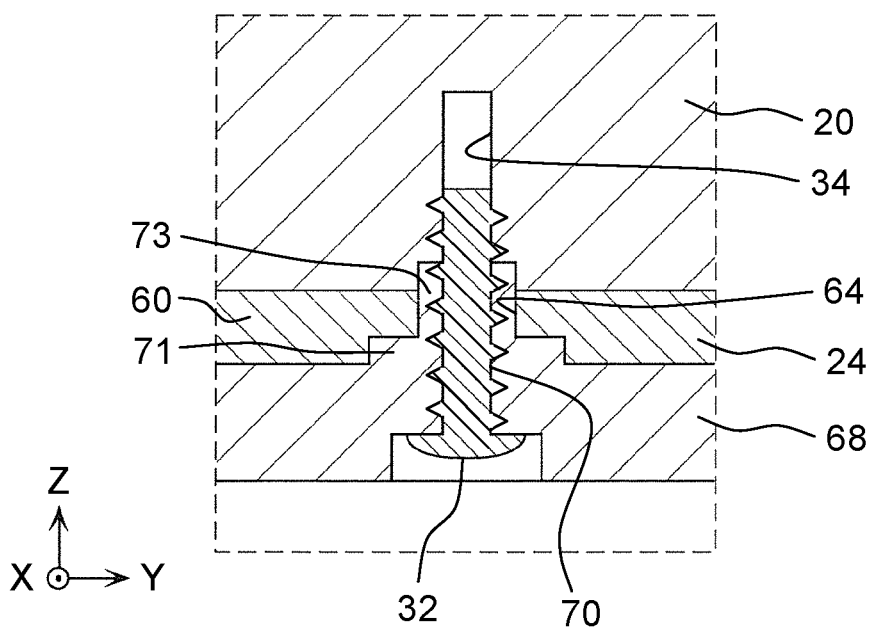
FIG. 6B is a partially sectional enlarged view schematically showing the internal structure of the stand according to the first exemplary embodiment.

FIG. 6B is a sectional view schematically showing an enlarged view of part of an internal structure of stand 6 according to the first exemplary embodiment. The sectional view shown in FIG. 6B is a sectional view taken along line VIB-VIB in FIG. 5.

Elastic body 24 is a member for preventing electronic device 2 from falling down by being attached by suction to sucked surface 16*a*. Elastic body 24 is formed into a sheet shape having a thickness of, for example, about 1 mm to 2 mm. Elastic body 24 is formed from an elastic material such as silicon, urethane, or rubber.

Specific examples of the material forming elastic body 24 include a material containing silicon or urethane as a main component and having a hardness between 40% and 70% (inclusive).

In a case where a surface of sucked surface 16*a* has unevenness, when the material forming elastic body 24 is soft, followability to the unevenness increases, and when the material is hard, followability to the unevenness decreases. On the other hand, when the material forming elastic body 24 is hard, a strength against force (peeling force) that causes elastic body 24 to peel off from sucked surface 16*a* increases, when the material is soft, the peeling force decreases.

It is preferable to suppress aging degradation of the material of elastic body 24 as much as possible.

Present inventors have conducted various experiments and studied about a material that can improve reliability of a function of elastic body 24 as a suction cup by suppressing degradation of the material for a long time, has good followability to unevenness of the surface of sucked surface 16*a*, and can obtain a sufficient strength against a peeling force. The present inventors have confirmed as a result of the experiments that the material described above as a specific example can satisfy these requirements.

As shown in FIGS. 5, 6A, 7, and 8, elastic body 24 includes attaching portion 60 and suction portion 62. Attaching portion 60 is formed into a circular shape in planar view (when viewed from the negative Z-axis direction) and is accommodated in recess portion 30 of base portion 20. A plurality of holes 64 are formed in attaching portion 60 so as to allow the plurality of screws 32 to extend through. As shown in FIGS. 6B and 7, the plurality of holes 64 are provided at positions corresponding to the plurality of screw holes 34 of base portion 20, and are arranged at intervals in a circumferential direction of attaching portion 60. In addition, as shown in FIGS. 6A and 7, ventilation hole 66 communicating with through hole 36 of base portion 20 is formed in attaching portion 60. Ventilation hole 66 is formed to have a smaller diameter than through hole 36 of base portion 20. This allows on-off valve 74 accommodated in through hole 36 to close ventilation hole 66.

Suction portion 62 is provided on an outer peripheral edge of attaching portion 60 so as to extend from the outer peripheral edge of attaching portion 60 outward in a radial direction, and is formed into a trumpet shape (umbrella shape). Suction portion 62 is disposed on a lower surface (a surface on the negative Z-axis direction side) of base portion 20. Suction surface 62*a* in a ring shape in planar view (when viewed from the negative Z-axis direction side) is formed on a lower surface (a surface on the negative Z-axis direction side) of suction portion 62.

Suction portion 62 is formed such that a radially outer portion is thinner than a radially inner portion in the Z-axis direction. Suction portion 62 may be formed so as to gradually decrease in thickness in the Z-axis direction from a radially inner side to a radially outer side, or may be formed so as to decrease in thickness stepwise.

Suction portion 62 increases in strength with an increase in thickness in the Z-axis direction and decreases in strength with a decrease in thickness in the Z-axis direction. On the other hand, when a force that causes elastic body 24 to peel off from sucked surface 16*a* (a force that lifts elastic body 24 from sucked surface 16*a* in the positive Z-axis direction) is exerted on a portion near a center of elastic body 24, a force that pulls a radially outer portion of suction portion 62 toward a radially inner portion is exerted on suction portion 62. At this time, if the radially outer portion of suction portion 62 is as thick as the radially inner portion in the Z-axis direction, the radially outer portion of suction portion 62 is resistant to elastic deformation, and is difficult to extend in a direction in which a force is applied. This tends to cause a wrinkle on suction portion 62. Air tends to leak into gap 102 through the wrinkle. If, however, the radially outer portion of suction portion 62 is thinner than the radially inner portion in the Z-axis direction, when the above force is exerted on elastic body 24, the radially outer portion of suction portion 62 tends to elastically deform in a direction in which the force is applied. As a consequence, the radially outer portion tends to extend from an outer side to an inner side in the radial direction. This allows elastic body 24 to suppress occurrence of a wrinkle on suction portion 62, thereby preventing air from leaking into gap 102.

Note that the radially outer portion and the radially inner portion of suction portion 62 vary in optimal thickness in the Z-axis direction depending on a material forming elastic body 24, specifications of stand 6, and the like. Accordingly, it is preferable to properly set thicknesses of the radially outer portion and the radially inner portion of suction portion 62 in the Z-axis direction in consideration of a material forming elastic body 24, specifications of stand 6 which include a strength, a suction force, and like required for elastic body 24, and the like.

As shown in FIGS. 5, 6A, 7, and 8, attaching portion 60 is pressed on recess portion 30 of base portion 20 with pressing member 68. Pressing member 68 is formed into a circular shape in planar view (when viewed from the negative Z-axis direction side). A plurality of holes 70 are formed in pressing member 68 so as to allow the plurality of screws 32 to extend through. As shown in FIGS. 6B and 7, the plurality of holes 70 are provided at positions respectively corresponding to the plurality of screw holes 34 of base portion 20 so as to be arranged at intervals in the circumferential direction of pressing member 68. As shown in FIGS. 6A and 7, ventilation hole 72 communicating with ventilation hole 66 of attaching portion 60 is formed in pressing member 68. Ventilation hole 72 is formed to have a diameter substantially equal to a diameter of ventilation hole 66 of attaching portion 60.

As shown in FIG. 7, attaching portion 60 and pressing member 68 are fixed to recess portion 30 of base portion 20 by screwing screws 32 into screw holes 34 of base portion 20 through holes 70 of pressing member 68 and holes 64 of attaching portion 60. At this time, attaching portion 60 is pressed on recess portion 30 of base portion 20 with pressing member 68.

Although described in detail later with reference to FIG. 11, when base portion 20 is placed on sucked surface 16*a*, leg portions 28 come into contact with sucked surface 16*a*, and the outer peripheral portion of suction surface 62*a* of suction portion 62 comes into tight contact with sucked surface 16*a*. As a result, leg portions 28 form gap 102 between a lower surface (a surface on the negative Z-axis direction side) of pressing member 68 and sucked surface 16*a* and between an inner peripheral portion of suction surface 62*a* of suction portion 62 and sucked surface 16*a*. Gap 102 communicates with ventilation hole 66 of elastic body 24 through ventilation hole 72 of pressing member 68. In this case, however, ventilation hole 66 is closed by on-off valve 74. Accordingly, gap 102 in this case is in a state where substantially hermitically closed.

As shown in FIG. 6B, compression portion 71 and press-fitting portion 73 are formed on an outer peripheral portion of each of the plurality of holes 70 on an upper surface (a surface on the positive Z-axis direction side) of pressing member 68. Compression portion 71 is formed into a columnar shape so as to protrude from the upper surface of pressing member 68 toward attaching portion 60 of elastic body 24 (in the positive Z-axis direction). Press-fitting portion 73 is formed into a columnar shape so as to protrude from an upper end face of compression portion 71 toward base portion 20 (in the positive Z-axis direction). In addition, press-fitting portion 73 is formed to have a diameter smaller than a diameter of compression portion 71 and larger than a diameter of hole 64 of attaching portion 60. The plurality of holes 70 each are formed to extend through the compression portion 71 and press-fitting portion 73.

As shown in FIG. 6B, while screw 32 is screwed into screw hole 34 of base portion 20, press-fitting portion 73 is press-fitted into hole 64 of attaching portion 60. At this time, press-fitting portion 73 is inserted into hole 64 while pressing and expanding hole 64 outward in a radial direction. In addition, compression portion 71 compresses an outer peripheral portion of hole 64 of attaching portion 60 toward base portion 20 (in the positive Z-axis direction).

When an outer peripheral portion of suction surface 62a of suction portion 62 is attached by suction to sucked surface 16a, attaching portion 60 of elastic body 24 is pulled outward in the radial direction by the outer peripheral portion of suction portion 62 attached by suction to sucked surface 16a. However, because each press-fitting portion 73 is press-fitted into hole 64 of attaching portion 60 and each compression portion 71 compresses the outer peripheral portion of hole 64 of attaching portion 60 toward base portion 20, press-fitting portion 73 is kept in tight contact with hole 64 of attaching portion 60 even in this state. This makes it possible to suppress, in stand 6, leakage of air into gap 102 through holes 64 of attaching portion 60.

[1-2-5. Valve Mechanism]

Valve mechanism 26 will be described next with reference to FIGS. 6A and 8 to 10.

Figure 9:
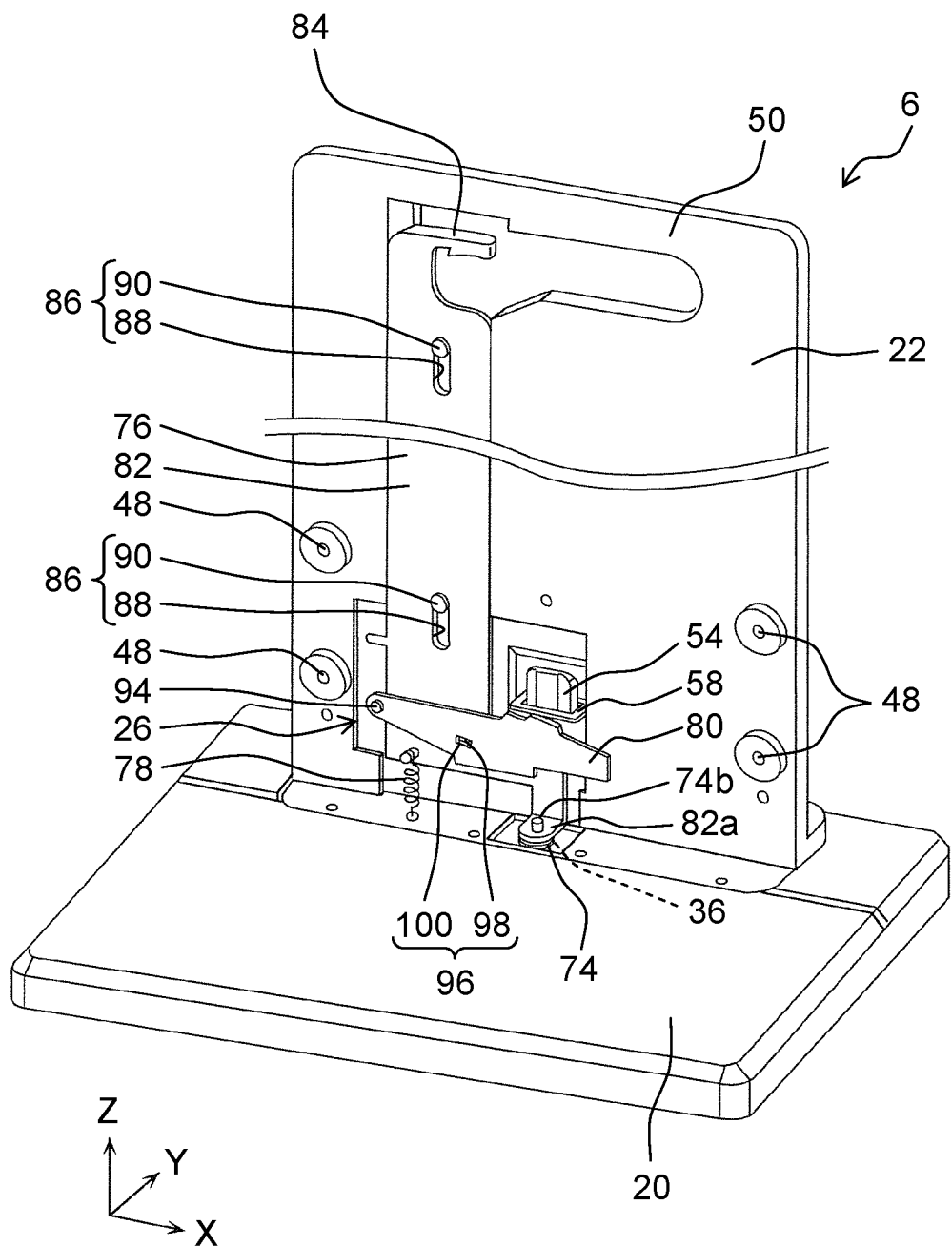
FIG. 9 is a perspective view schematically showing an example of a valve mechanism of the stand according to the first exemplary embodiment.
Figure 10:
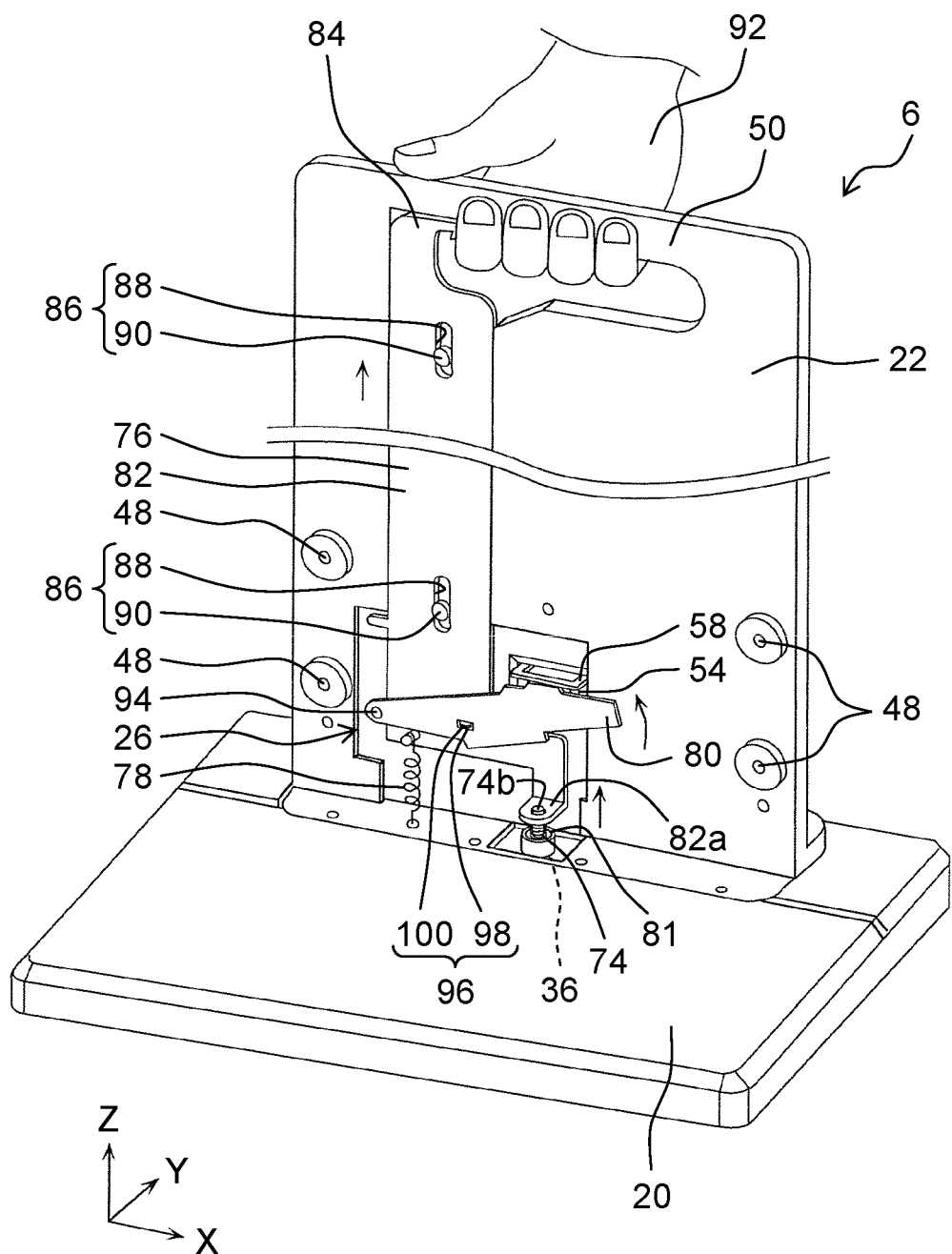
FIG. 10 is a perspective view schematically showing an example of the valve mechanism of the stand according to the first exemplary embodiment.

FIGS. 9 and 10 are perspective views schematically showing an example of valve mechanism 26 of stand 6 according to the first exemplary embodiment. FIG. 9 shows a state in which on-off valve 74 is located at a position to close ventilation hole 66 (to be referred to as the "close position" hereinafter). FIG. 10 shows a state in which on-off valve 74 is located at a position to open ventilation hole 66 (to be referred to as the "open position" hereinafter). Now that FIGS. 9 and 10 show only a portion of valve mechanism 26 of stand 6 which is associated with an opening and closing operation while omitting an illustration of other constituent elements, for the sake of convenience.

Valve mechanism 26 is a mechanism for switching between letting air flow into gap 102 (see FIG. 11) and shutting off air. As shown in FIGS. 6A and 8, valve mechanism 26 includes ventilation hole 66 of elastic body 24 described above, on-off valve 74, operation member 76, biasing member 78, and releasing member 80.

On-off valve 74 is a valve for opening and closing ventilation hole 66 of elastic body 24. On-off valve 74 is formed into a substantially columnar shape and movably accommodated in through hole 36 of base portion 20. On-off valve 74 can move along through hole 36 of base portion 20 between the close position (see FIGS. 6A and 9) to close ventilation hole 66 and the open position (see FIG. 10) to open ventilation hole 66. The open position is located on the positive Z-axis direction side relative to the close position. When on-off valve 74 is located at the open position, air flows into gap 102 (see FIG. 11) through through hole 36 of base portion 20, ventilation hole 66 of elastic body 24, and ventilation hole 72 of pressing member 68. When on-off valve 74 is located at the close position, on-off valve 74 close ventilation hole 66 and hence shuts off air into gap 102. Note that on-off valve 74 is formed to have a diameter smaller than a diameter of through hole 36 and larger than a diameter of ventilation hole 66. This allows air to pass through a gap between on-off valve 74 and a wall surface of through hole 36. In addition, on-off valve 74 can close ventilation hole 66.

Note that as shown in FIGS. 6A and 10, coil spring 81 whose one end portion connected to a bottom surface (a surface on the negative Z-axis direction side) of a lower end portion (a lower end portion of connecting portion 82) of operation member 76 has the other end portion attached to on-off valve 74. More specifically, as shown in FIGS. 6A and 8, part of a lower end portion of operation member 76 (a lower end portion of connecting portion 82) is bent in an L shape in a negative Y-axis direction to provide connecting region 82a, and one end portion of coil spring 81 is mounted on a bottom surface (a surface on the negative Z-axis direction side) of connecting region 82a. The other end portion of coil spring 81 is fitted in groove 74c recessed in the negative Z-axis direction which is provided for on-off valve 74 and is attached to on-off valve 74. When connecting portion 82 of operation member 76 is located at a first position (to be described later), on-off valve 74 is pressed toward the close position by coil spring 81. Even in a case where on-off valve 74 is small in weight, and hence it is difficult for on-off valve 74 located at the close position to close ventilation hole 66 by only its own weight, when connecting portion 82 is located at the first position, because coil spring 81 presses on-off valve 74 against an upper side (on the positive Z-axis direction side) of ventilation hole 66 in the negative Z-axis direction, on-off valve 74 can close ventilation hole 66.

Operation member 76 is a member for operating on-off valve 74 and is used to move on-off valve 74 between open position and the close position. Operation member 76 includes connecting portion 82 and grip portion 84. Connecting portion 82 connects grip portion 84 to on-off valve 74.

Connecting portion 82 is disposed on an inner surface (a surface on device main body 4 side or a surface on the negative Y-axis direction side) of support portion 22, and is formed into a shape elongated along a longitudinal direction (Z-axis direction) of support portion 22. An upper end portion of connecting portion 82 is connected to grip portion 84, and connecting region 82a at the lower end portion of connecting portion 82 is connected to on-off valve 74 through coil spring 81. In addition, pin 74b provided for on-off valve 74 is attached to connecting region 82a. A pair of guide mechanisms 86 allow connecting portion 82 to move along the longitudinal direction (Z-axis direction) of connecting portion 82 between a first position and a second position. As shown in FIG. 9, the first position is a position at which on-off valve 74 is located at the close position. As shown in FIG. 10, the second position is a position at which on-off valve 74 is located at the open position. The second position is a position located on the positive Z-axis direction side relative to the first position. Connecting portion 82 moves between the first position and the second position to move on-off valve 74 between the close position and the open position.

The pair of guide mechanisms 86 each include groove portion 88 and protruding portion 90. Each groove portion 88 is a hole provided in connecting portion 82 and is formed into a shape extending along a longitudinal direction (Z-axis direction) of connecting portion 82. Each protruding portion 90 is formed into a convex shape in the negative Y-axis direction on an inner surface of support portion 22 (a surface on the device main body 4 side or a surface on the negative Y-axis direction side), and is inserted into groove portion 88. Protruding portion 90 and groove portion 88 are formed so as to allow protruding portion 90 inserted in groove portion 88 to relatively slide along groove portion 88. In addition, the pair of guide mechanisms 86 are provided at positions spaced away from each other in the Z-axis direction, as shown in FIGS. 9 and 10. With these configurations, movement, with respect to support portion 22, of groove portion 88 in which protruding portion 90 is inserted is restricted in the Z-axis direction. That is, a moving direction of connecting portion 82 is restricted in the Z-axis direction by the pair of guide mechanisms 86. This makes connecting portion 82 linearly move in the Z-axis direction between the first position at which on-off valve 74 is located at the close position and the second position at which on-off valve 74 is located at the open position.

Grip portion 84 is disposed on handle 50 of support portion 22 so as to allow the user to grip. More specifically, grip portion 84 is formed such that when the user holds handle 50 with hand 92, at least part of hand 92 (for example, an index finger) of the user is hooked on grip portion 84, as shown in FIG. 10. With this configuration, when the user inserts hand 92 into handle 50 of support portion 22 and lifts handle 50 in the positive Z-axis direction, grip portion 84 is pulled upward in the positive Z-axis direction with part of hand 92 (for example, an index finger) of the user, thus causing connecting portion 82 to move from the first position to the second position (in the positive Z-axis direction). Connecting region 82a at the lower end portion of connecting portion 82 moves in the positive Z-axis direction accompanying this operation, and pin 74b of on-off valve 74 attached to connecting region 82a is pulled upward (in the positive Z-axis direction), thereby causing on-off valve 74 to move from the close position to the open position (in the positive Z-axis direction). Note that grip portion 84 may be provided with indentations to allow the user to easily hook his/her fingers.

Biasing member 78 is a member for exerting a biasing force on connecting portion 82 in a direction from the second position to the first position (in the negative Z-axis direction). Exerting a biasing force on connecting portion 82 in the direction from the second position to the first position can move on-off valve 74 from the open position to the close position (in the negative Z-axis direction). Biasing member 78 is formed from, for example, a coil spring. As shown in FIG. 9, biasing member 78 is connected between the lower end portion of connecting portion 82 and the upper surface of base portion 20. When connecting portion 82 moves from the first position to the second position, biasing member 78 exerts a biasing force on connecting portion 82 toward the first position (in the negative Z-axis direction) with the elastic restoring force. When a force that keeps connecting portion 82 at the second position is lost as, for example, the user releases hand 92 from handle 50 (grip portion 84), connecting portion 82 is biased toward the first position by biasing member 78 to move from the second position to the first position. At this time, coil spring 81 mounted on connecting region 82a at the lower end portion of connecting portion 82 biases on-off valve 74 from the open position to the close position (in the negative Z-axis direction). Accordingly, on-off valve 74 moves from the open position to the close position. In this manner, biasing member 78 biases on-off valve 74 connected to connecting portion 82 from the open position to the close position (in the negative Z-axis direction) by biasing connecting portion 82 from the second position to the first position (in the negative Z-axis direction).

Releasing member 80 is a member for releasing engagement between buckle 58 of fixing belt 56 and hook portion 54. As shown in FIGS. 9 and 10, releasing member 80 is tiltably supported on shaft portion 94 formed on the inner surface of support portion 22 (a surface on the device main body 4 side or a surface on the negative Y-axis direction side). Interlocking mechanism 96 causes releasing member 80 to tilt about shaft portion 94 between a lower limit position and an upper limit position in interlocking with movement of connecting portion 82 between the first position and the second position. The lower limit position is a position at which releasing member 80 does not release engagement between buckle 58 of fixing belt 56 and hook portion 54 (see FIG. 9). The upper limit position is a position at which releasing member 80 releases engagement between buckle 58 of fixing belt 56 and hook portion 54 (see FIG. 10). The upper limit position is located on the positive Z-axis direction side relative to the lower limit position. Interlocking mechanism 96 includes groove portion 98 and protruding portion 100. Groove portion 98 is a horizontally long (extending in an X-axis direction) hole formed in releasing member 80. Protruding portion 100 is formed into a convex shape in the negative Y-axis direction on an inner surface (a surface on the device main body 4 side or a surface on the negative Y-axis direction side) of connecting portion 82, and is inserted in groove portion 98. Protruding portion 100 and groove portion 98 are formed to allow protruding portion 100 inserted in groove portion 98 to slide along groove portion 98. With this configuration, releasing member 80 can tilt about shaft portion 94 in interlocking with movement of connecting portion 82.

As shown in FIGS. 9 and 10, releasing member 80 tilts from the lower limit position to the upper limit position (in the positive Z-axis direction) when connecting portion 82 moves from the first position to the second position. As shown in FIG. 10, when tilting from the lower limit position to the upper limit position, releasing member 80 acts on (that is, comes into contact with) buckle 58 of fixing belt 56 from down (from the negative Z-axis direction side) to push buckle 58 upward (in the positive Z-axis direction). In this manner, releasing member 80 lifts buckle 58 of fixing belt 56 upward (in the positive Z-axis direction) and releases engagement between buckle 58 of fixing belt 56 and hook portion 54.

[1-3. Operation of Stand]

An operation of stand 6 will be described next with reference to FIG. 11.

Figure 11:
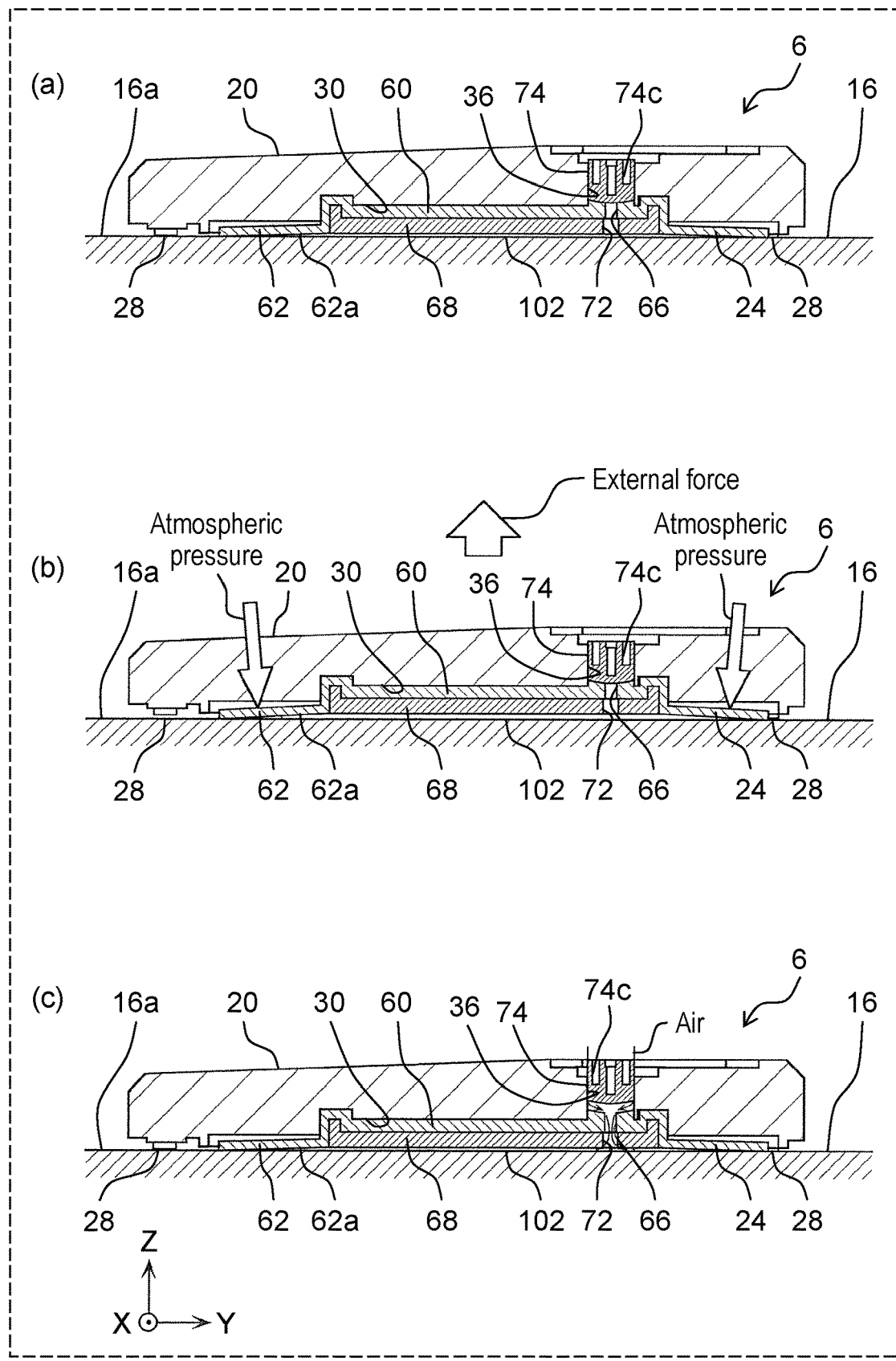
FIG. 11 is a view for describing an operation of the stand according to the first exemplary embodiment.

FIG. 11 is a view for describing the operation of stand 6 according to the first exemplary embodiment. Note that FIG. 11 is a sectional view showing only main constituent elements associated with the following description while omitting an illustration of other constituent elements, for the sake of convenience.

Part (a) of FIG. 11 shows a state in which base portion 20 of stand 6 is placed on sucked surface 16a of mount table 16 without exerting any external force on stand 6 in a direction to separate from sucked surface 16a of stand 6 (that is, a normal state). At this time, the outer peripheral portion of suction surface 62a of suction portion 62 is in tight contact with sucked surface 16a, and gap 102 is formed between a lower surface (a surface on the negative Z-axis direction) of pressing member 68 and sucked surface 16a and between an inner peripheral portion of suction surface 62a of suction portion 62 and sucked surface 16a. In addition, because connecting portion 82 of operation member 76 is located at the first position, on-off valve 74 is located at the close position. In the state indicated by part (a) of FIG. 11, an elastic restoring force that restores suction portion 62 to its original shape is not exerted on suction portion 62 unlike in a case of a conventional general suction cup. This is because, as will be described later, in the case of stand 6 according to this exemplary embodiment, when some external force is exerted on electronic device 2 so as to exert an external force on stand 6 in a direction to separate from sucked surface 16a, negative pressure is generated in gap 102, whereas when such an external force is not exerted on stand 6, negative pressure is not substantially generated in gap 102. That is, in the state indicated by part (a) of FIG. 11, substantially no negative pressure is generated in gap 102 because air pressure in gap 102 is substantially equal to surrounding air pressure, and the outer peripheral portion of suction surface 62a of suction portion 62 is in tight contact with sucked surface 16a without being attached by suction. Assume that in this exemplary embodiment, a height of leg portions 28 (a magnitude in the Z-axis direction) is properly set such that when stand 6 is in the state (normal state) indicated by part (a) of FIG. 11, the outer peripheral portion of suction surface 62a of suction portion 62 is in tight contact with sucked surface 16a, and no negative pressure is substantially generated in gap 102.

Note that suction portion 62 is formed into a trumpet shape and has elasticity, and hence even if sucked surface 16a has unevenness, the shape of suction portion 62 can be deformed in accordance with the unevenness of sucked surface 16a. This makes it possible for suction portion 62 to let the outer peripheral portion of suction surface 62a of suction portion 62 come into tight contact with sucked surface 16a.

Part (b) of FIG. 11 shows a state in which base portion 20 of stand 6 is placed on sucked surface 16a of mount table 16, and an external force is exerted on stand 6 in a direction to separate from sucked surface 16a. Note that conceivable cases in which such an external force is exerted on stand 6 include, for example, case a) in which an earthquake occurs, case b) in which the user unintentionally moves mount table 16, and case c) in which a body of the user or the like comes into contact with device main body 4 or stand 6. At this time, on-off valve 74 is kept located at the close position as in the case indicated by part (a) of FIG. 11, and elastic body 24 is elastically deformed in a direction to separate from sucked surface 16a while the outer peripheral portion of suction surface 62a of suction portion 62 is in tight contact with sucked surface 16a to substantially hermetically close gap 102. This increases a volume of gap 102 from the state indicated by part (a) of FIG. 11 to reduce an air pressure in gap 102 relative to a surrounding air pressure, thus generating negative pressure in gap 102. Suction portion 62 in this state is pressed toward sucked surface 16a by atmospheric pressure, and hence the outer peripheral portion of suction surface 62a of suction portion 62 is attached by suction to sucked surface 16a. This suppresses falling down of electronic device 2.

Part (c) of FIG. 11 shows a state in which the user holds handle 50 with hand 92 (see FIG. 10), and lifts electronic device 2 from sucked surface 16a of mount table 16. In this state, as described above, because the user pulls grip portion 84 of operation member 76 upward (in the positive Z-axis direction) with hand 92, connecting portion 82 of operation member 76 moves from the first position to the second position. With this operation, pin 74b (see FIG. 6A) of on-off valve 74 mounted on connecting region 82a at the lower end portion of connecting portion 82 is pulled upward (in the positive Z-axis direction), and on-off valve 74 moves from the close position to the open position, thereby opening ventilation hole 66. As a result, air flows into gap 102 through hole 36 of base portion 20, ventilation hole 66 of elastic body 24, and ventilation hole 72 of pressing member 68, and air pressure in gap 102 is kept substantially equal to surrounding air pressure. With this operation, even if the user exerts an external force on electronic device 2 upward (in the positive Z-axis direction) to lift electronic device 2, no negative pressure is generated in gap 102 unlike in the state indicated by part (b) of FIG. 11. That is, suction surface 62a of suction portion 62 is not attached by suction to sucked surface 16a. In addition, when connecting portion 82 moves from the first position to the second position, releasing member 80 tilts from the lower limit position to the upper limit position. As described above, this releases engagement between buckle 58 of fixing belt 56 and hook portion 54. These operations allow the user to lift electronic device 2 from sucked surface 16a of mount table 16.

After the user holds handle 50 with hand 92 and lifts electronic device 2 from sucked surface 16a of mount table 16, if the user lowers electronic device 2 to sucked surface 16a of mount table 16 and releases hand 92 from handle 50, connecting portion 82 of operation member 76 moves from the second position to the first position with an elastic restoring force of biasing member 78. At this time, on-off valve 74 is pressed through coil spring 81 in the negative Z-axis direction by connecting region 82a at the lower end portion of connecting portion 82 to move from the open position to the close position. This sets again stand 6 in a state indicated by part (a) of FIG. 11 described above. That is, when the user places base portion 20 of stand 6 on sucked surface 16a, the outer peripheral portion of suction surface 62a comes into tight contact with sucked surface 16a to set gap 102 in a substantially hermetically closed state. This allows suction portion 62 to be attached by suction to sucked surface 16a. Note that engaging buckle 58 of fixing belt 56 with hook portion 54 can more reliably suppress falling down of electronic device 2.

[1-4. Effects and Like]

As described above, the electronic device according to this exemplary embodiment includes the device main body and the stand that is placed on the sucked surface and supports the device main body. The stand includes the base portion and the elastic body that is placed on the lower surface of the base portion and has the suction surface attached by suction to the sucked surface with the negative pressure generated in the gap between the sucked surface and the suction surface. The elastic body generates no negative pressure in the gap when no external force is exerted on the stand in a direction to separate from the sucked surface while the stand is placed on the sucked surface. The elastic body generates negative pressure in the gap when the external force is exerted on the stand in a direction to separate from the sucked surface while the stand is placed on the sucked surface.

In addition, the stand according to this exemplary embodiment is a stand that is placed on the sucked surface and supports the device main body, and includes the base portion and the elastic body that is placed on the lower surface of the base portion and has the suction surface attached by suction to the sucked surface with the negative pressure generated in the gap between the sucked surface and the suction surface. The elastic body generates no negative pressure in the gap when no external force is exerted on the stand in a direction to separate from the sucked surface while the stand is placed on the sucked surface. The elastic body generates negative pressure in the gap by being elastically deformed in the direction to separate from the sucked surface when the external force is exerted on the stand while the stand is placed on the sucked surface.

Note that electronic device 2 is an example of an electronic device. Device main body 4 is an example of a device main body. Sucked surface 16a is an example of a sucked surface. Stand 6 is an example of a stand. Base portion 20 is an example of a base portion. Gap 102 is an example of a gap. Suction surface 62a is an example of a suction surface. Elastic body 24 is an example of an elastic body.

For example, electronic device 2 according to the first exemplary embodiment includes device main body 4 and stand 6 that is placed on sucked surface 16a and supports device main body 4. Stand 6 includes base portion 20 and elastic body 24 that is placed on the lower surface of base portion 20 and has suction surface 62a attached by suction to sucked surface 16a with negative pressure generated in gap 102 between suction surface 62a and sucked surface 16a. Elastic body 24 generates no negative pressure in gap 102 when no external force is exerted on stand 6 in a direction to separate from sucked surface 16a while stand 6 is placed on sucked surface 16a. Elastic body 24 generates negative pressure in gap 102 by being elastically deformed in a direction to separate from sucked surface 16a when the external force is exerted on stand 6 while stand 6 is placed on sucked surface 16a.

When using electronic device 2 having such a configuration, the user can make suction surface 62a of elastic body 24 ready to be attached by suction to sucked surface 16a by performing a simple operation of placing base portion 20 of stand 6 on sucked surface 16a. When an external force is exerted on stand 6 in a direction to separate from sucked surface 16a due to, for example, an earthquake, elastic body 24 is elastically deformed in a direction to separate from sucked surface 16a. This generates negative pressure in gap 102 and makes the outer peripheral portion of suction surface 62a of suction portion 62 be attached by suction to sucked surface 16a. This suppresses falling down of electronic device 2. As described above, according to this exemplary embodiment, using a simple configuration can suppress falling down of electronic device 2.

On the other hand, substantially no negative pressure is generated in gap 102 when no external force is exerted on stand 6 in a direction to separate from sucked surface 16a (in a normal state) while stand 6 is placed on sucked surface 16a. That is, an elastic restoring force that restores elastic body 24 to its original shape is not substantially exerted as a load on elastic body 24 unlike a conventional general suction cup unless an external force is exerted on stand 6 in a direction to separate from sucked surface 16a. As described above, in stand 6, since an elastic restoring force is suppressed from being always exerted as a load on elastic body 24, degradation of elastic body 24 can be reduced. This makes it possible to maintain an effect of suppressing falling down of electronic device 2 over a long period of time in stand 6 according to this exemplary embodiment.

According to a conventional general suction cup, because negative pressure is always generated between the suction cup and a sucked surface, when a foreign substance such as hair is tucked between the suction cup and the sucked surface, air leaks from the outside into the gap due to the foreign substance. Air keeps leaking into the gap until negative pressure in the gap is lost (until air pressure in gap becomes equal to surrounding air pressure). This gradually reduces negative pressure generated in the gap between the suction cup and the sucked surface. As a consequence, suction force of the suction cup with respect to the sucked surface is gradually lost. In contrast to this, in electronic device 2 according to this exemplary embodiment, negative pressure is generated in gap 102 at the instant when an external force is exerted on stand 6. Accordingly, even if a foreign substance such as hair is tucked between suction surface 62a of elastic body 24 and sucked surface 16a, negative pressure generated in gap 102 can be kept relatively high until the external force is lost (for example, until earthquake shaking ceases) as long as the external force is exerted on stand 6 for a short period of time (for example, about duration of earthquake). This can suppress falling down of electronic device 2. As described above, electronic device 2 according to this exemplary embodiment can obtain an effect of suppressing falling down of electronic device 2 even if a foreign substance such as hair is tucked between suction surface 62a of elastic body 24 and sucked surface 16a.

In this electronic device, the elastic body may be formed into a sheet shape.

For example, in electronic device 2 according to the first exemplary embodiment, elastic body 24 is formed into a sheet shape.

Electronic device 2 having this configuration allows suction surface 62a of elastic body 24 to easily come into tight contact sucked surface 16a.

In this electronic device, the suction surface may be formed into a ring shape.

For example, in electronic device 2 according to the first exemplary embodiment, suction surface 62a is formed into a ring shape.

Electronic device 2 having this configuration allows suction surface 62a to be stably attached by suction to sucked surface 16a throughout all circumferential directions of suction surface 62a.

This electronic device may further include a valve mechanism for switching between letting air flow into gap and shutting off air. The valve mechanism may include a ventilation hole formed in the elastic body and communicating with the gap, an on-off valve that is placed on the base portion and can move between an open position to open the ventilation hole and a close position to close the ventilation hole, and an operation member for moving the on-off valve between the open position and the close position.

Note that valve mechanism 26 is an example of a valve mechanism. Ventilation hole 72 is an example of a ventilation hole. On-off valve 74 is an example of an on-off valve. Operation member 76 is an example of an operation member.

For example, electronic device 2 according to the first exemplary embodiment includes, in stand 6, valve mechanism 26 for switching between letting air flow into gap 102 and shutting off air. Valve mechanism 26 includes ventilation hole 72 formed in elastic body 24 and communicating with gap 102, on-off valve 74 that is placed on base portion 20 and can move between the open position to open ventilation hole 72 and the close position to close ventilation hole 72, and operation member 76 for moving on-off valve 74 between the open position and the close position.

Electronic device 2 having this configuration allows the user to, for example, lift electronic device 2 from sucked surface 16a and move electronic device 2 to another place by operating operation member 76 to move on-off valve 74 from the close position to the open position. When on-off valve 74 is located at the close position, ventilation hole 72 is closed to substantially hermetically close gap 102. Accordingly, when an external force is exerted on electronic device 2, negative pressure is generated in gap 102, and suction surface 62a of suction portion 62 is attached by suction to sucked surface 16a. However, when on-off valve 74 is located at the open position, air flows into gap 102 through opened ventilation hole 72, and hence air pressure in gap 102 becomes substantially equal to surrounding air pressure. As a consequence, suction portion 62 is not substantially attached by suction to sucked surface 16a. This allows the user to easily lift electronic device 2 from sucked surface 16a and move electronic device 2.

In this electronic device, the valve mechanism may include a biasing member for biasing the on-off valve toward the close position.

Note that biasing member 78 is an example of a biasing member.

For example, in electronic device 2 according to the first exemplary embodiment, valve mechanism 26 includes biasing member 78 for biasing on-off valve 74 toward the close position.

In electronic device 2 having this configuration, biasing member 78 biases on-off valve 74 at the open position toward the close position (in the negative Z-axis direction). Therefore, when, for example, the user moves on-off valve 74 from the close position to the open position by operating operation member 76, lifts electronic device 2 from sucked surface 16a, moves electronic device 2 to another place, and installs electronic device 2 again, he/she can easily return on-off valve 74 from the open position to the close position.

This electronic device may further include a handle for lifting the electronic device. The operation member may include a grip portion grippably disposed on the handle and a connecting portion that connects the grip portion to the on-off valve and can move between a first position and a second position. The connecting portion may locate the on-off valve at the close position when the connecting portion is located at the first position, and may locate the on-off valve at the open position when the connecting portion is located at the second position.

Note that handle 50 is an example of a handle. Grip portion 84 is an example of a grip portion. Connecting portion 82 is an example of a connecting portion.

For example, electronic device 2 according to the first exemplary embodiment includes, on stand 6, handle 50 for lifting electronic device 2. Operation member 76 includes grip portion 84 grippably disposed on the handle 50 and connecting portion 82 that connects grip portion 84 to on-off valve 74 and can move from a first position to a second position. At the first position, connecting portion 82 locates on-off valve 74 at the close position. At the second position, connecting portion 82 locates on-off valve 74 at the open position.

Electronic device 2 having this configuration allows the user to lift grip portion 84 of operation member 76 upward (in the positive Z-axis direction) with hand 92 by gripping handle 50 with hand 92. With this operation, connecting portion 82 of operation member 76 moves from the first position to the second position, and on-off valve 74 moves from the close position to the open position. Accordingly, in electronic device 2, when, for example, the user grips handle 50 with hand 92 to lift electronic device 2, on-off valve 74 moves from the close position to the open position in interlocking with this operation. This allows the user to easily lift electronic device 2. In this manner, electronic device 2 can improve convenience for the user.

This electronic device may further include a hook portion for detachably engaging a fixing belt for fixing the electronic device. The valve mechanism may further include a releasing member that releases engagement between the fixing belt and the hook portion by acting on the fixing belt in interlocking with movement of the connecting portion from the first position to the second position.

Note that fixing belt 56 is an example of a fixing belt. Hook portion 54 is an example of a hook portion. Releasing member 80 is an example of a releasing member.

For example, electronic device 2 according to the first exemplary embodiment includes, on stand 6, hook portion 54 for detachably engaging fixing belt 56 for fixing electronic device 2. Valve mechanism 26 includes releasing member 80 that releases engagement between fixing belt 56 and hook portion 54 by acting on fixing belt 56 in interlocking with movement of connecting portion 82 from the first position to the second position.

Electronic device 2 having this configuration allows the user to lift grip portion 84 of operation member 76 upward (in the positive Z-axis direction) with hand 92 by gripping handle 50 with hand 92. This moves connecting portion 82 of operation member 76 from the first position to the second position. In interlocking with this movement, releasing member 80 acts on fixing belt 56 (pushes buckle 58 upward (in the positive Z-axis direction), thereby releasing engagement between fixing belt 56 and hook portion 54. This makes it unnecessary for the user to manually release engagement between fixing belt 56 and hook portion 54 when, for example, lifting electronic device 2. In this manner, electronic device 2 can improve convenience for the user.

This electronic device may further include a pressing member that presses the elastic body against the base portion, a first hole formed in the pressing member, a second hole formed in the elastic body, and a fixing member that fixes the pressing member and the elastic body to the base portion by being screwed into the base portion through the first hole and the second hole. The pressing member may include a press-fitting portion that is formed on an outer peripheral portion of the first hole and is press-fitted into the second hole.

Note that pressing member 68 is an example of a pressing member. Hole 70 is an example of a first hole. Hole 64 is an example of a second hole. Screw 32 is an example of a fixing member. Press-fitting portion 73 is an example of a press-fitting portion.

For example, electronic device 2 according to the first exemplary embodiment includes, in stand 6, pressing member 68 that presses elastic body 24 against base portion 20, holes 70 formed in pressing member 68, holes 64 formed in elastic body 24, and screws 32 that fix elastic body 24 to base portion 20 by being screwed into base portion 20 through holes 70 and holes 64. Pressing member 68 includes press-fitting portions 73 that are formed on outer peripheral portions of holes 70 and press-fitted into holes 64.

Electronic device 2 is configured such that when suction surface 62a of suction portion 62 is attached by suction to sucked surface 16a, elastic body 24 is pulled outward in the radial direction. However, in electronic device 2 having the above configuration, because press-fitting portions 73 are press-fitted into holes 64 of attaching portion 60, press-fitting portions 73 are kept in tight contact with holes 64 of attaching portion 60 even in the above case. This makes it possible for electronic device 2 to suppress leakage of air into gap 102 through holes 64 of attaching portion 60.

In this electronic device, the pressing member may further include a compression portion that is formed on an outer peripheral portion of a first hole and compresses an outer peripheral portion of a second hole of the elastic body toward a base portion.

Note that compression portion 71 is an example of a compression portion.

For example, in electronic device 2 according to the first exemplary embodiment, pressing member 68 includes compression portion 71 that is formed on an outer peripheral portion of hole 70 and compresses an outer peripheral portion of hole 64 of elastic body 24 toward base portion 20.

In electronic device 2 having this configuration, because press-fitting portions 73 can be reliably made to come into contact with holes 64 of attaching portion 60, leakage of air into gap 102 through holes 64 of attaching portion 60 can be more effectively suppressed.

Second Exemplary Embodiment

The second exemplary embodiment will be described next with reference to FIGS. 12 to 19. In the exemplary embodiments below including the second exemplary embodiment, constituent elements substantially identical to the constituent elements described in the first exemplary embodiment are given reference marks identical to reference marks of the constituent elements described in the first exemplary embodiment, and a description is omitted.

[2-1. Configuration of Stand]

A configuration of stand 6A according to the second exemplary embodiment will be described with reference to FIGS. 12 to 16.

Figure 12:
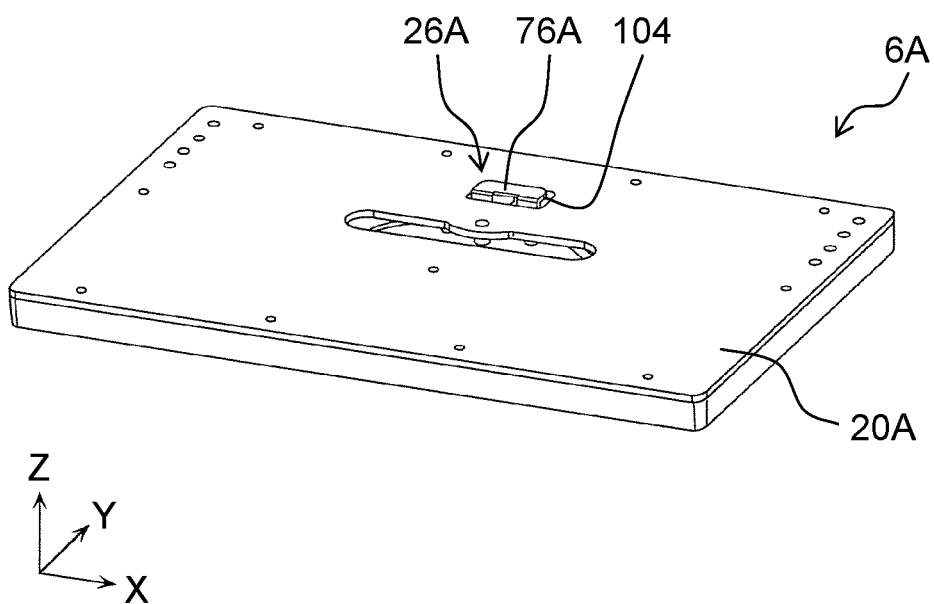
FIG. 12 is a perspective view schematically showing an example of an external appearance of a base portion of a stand according to a second exemplary embodiment.

FIG. 12 is a perspective view schematically showing an example of an outer appearance of base portion 20A of stand 6A according to the second exemplary embodiment. FIG. 12 indicates a perspective view of base portion 20A when viewed from a front surface side.

Figure 13:
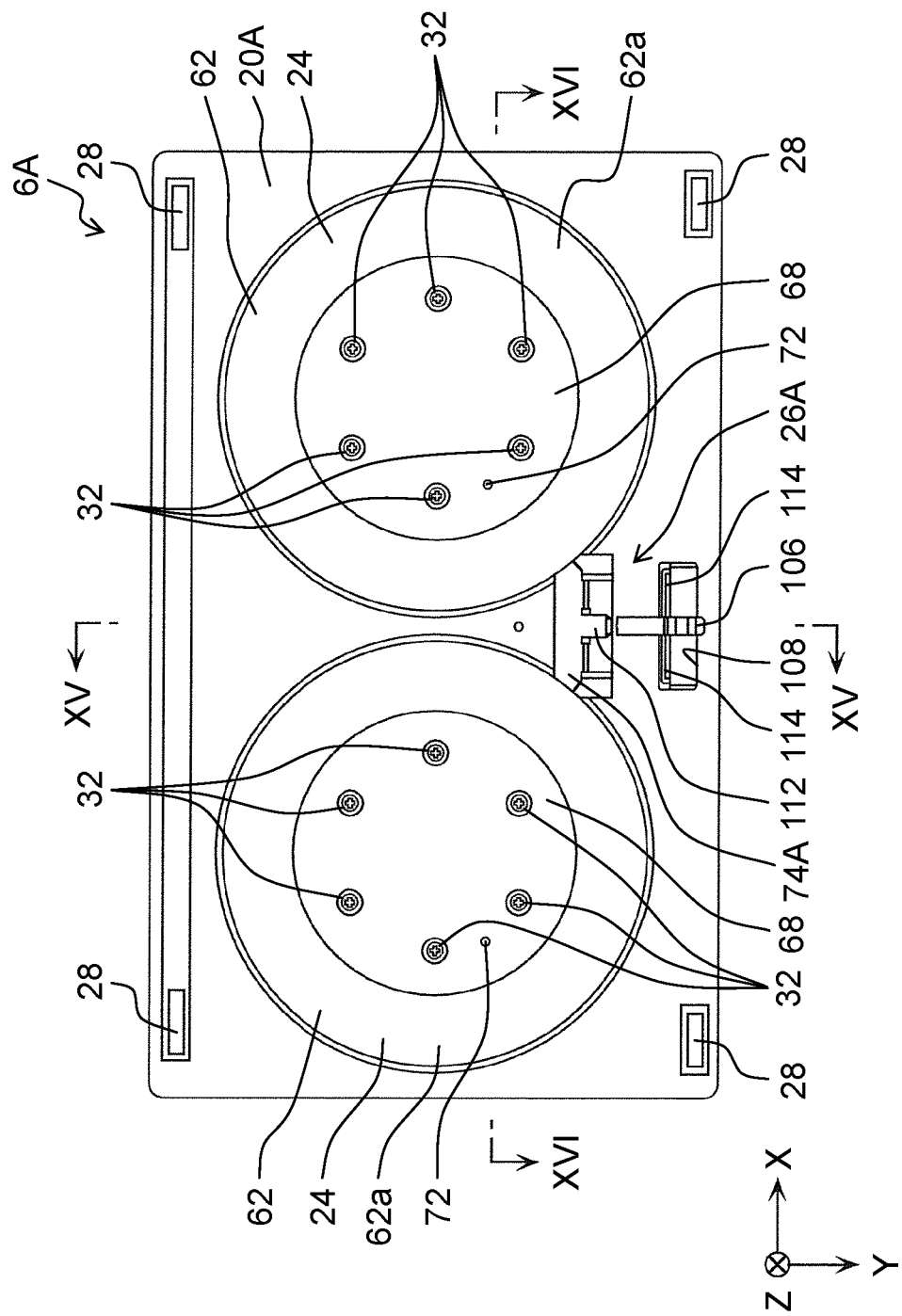
FIG. 13 is a view schematically showing an example of a configuration of a bottom surface of the stand according to the second exemplary embodiment.

FIG. 13 is a view schematically showing an example of a configuration of a bottom surface of stand 6A according to the second exemplary embodiment.

Figure 14:
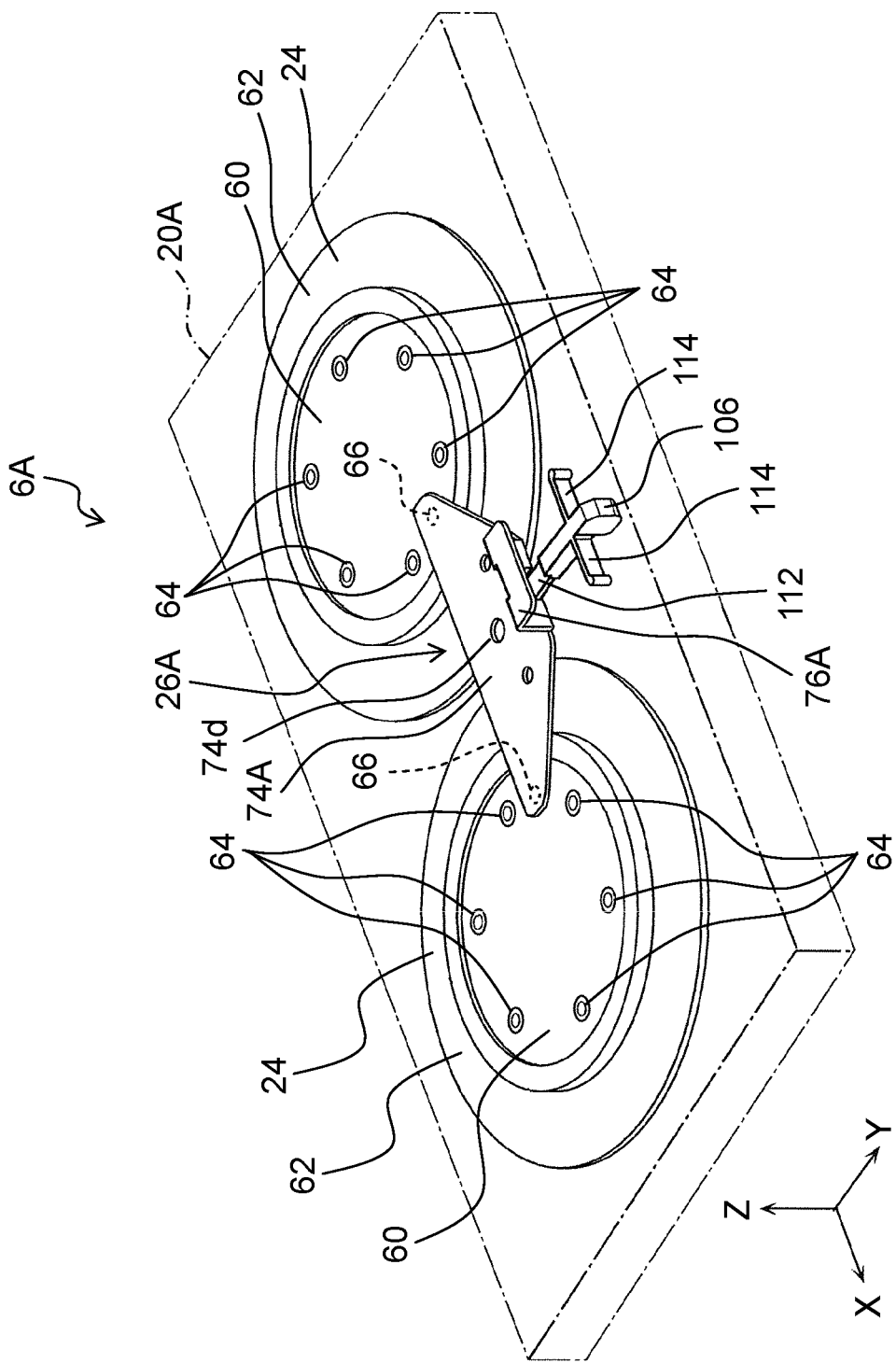
FIG. 14 is a transparent perspective view schematically showing an example of an internal structure of the stand according to the second exemplary embodiment.

FIG. 14 is a transparent perspective view schematically showing an example of an internal structure of stand 6A according to the second exemplary embodiment. FIG. 14 omits an illustration of some constituent elements such as an upper surface of base portion 20A in order to show an internal structure of stand 6A.

Figure 15:
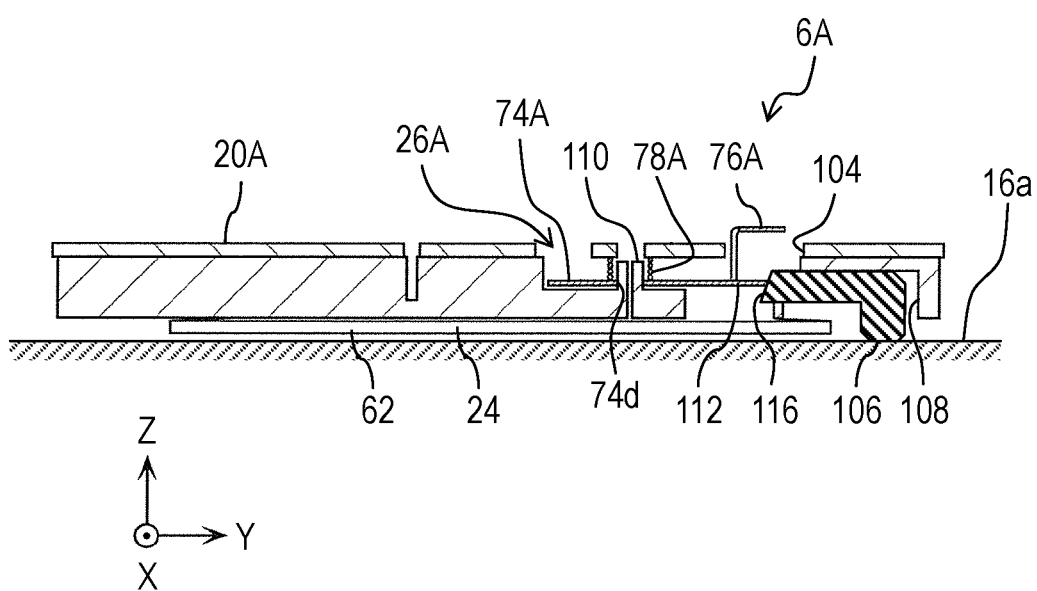
FIG. 15 is a sectional view schematically showing an example of the internal structure of the stand according to the second exemplary embodiment.

FIG. 15 is a sectional view schematically showing an example of the internal structure of stand 6A according to the second exemplary embodiment. FIG. 15 shows a sectional view taken along XV-XV in FIG. 13.

Figure 16:
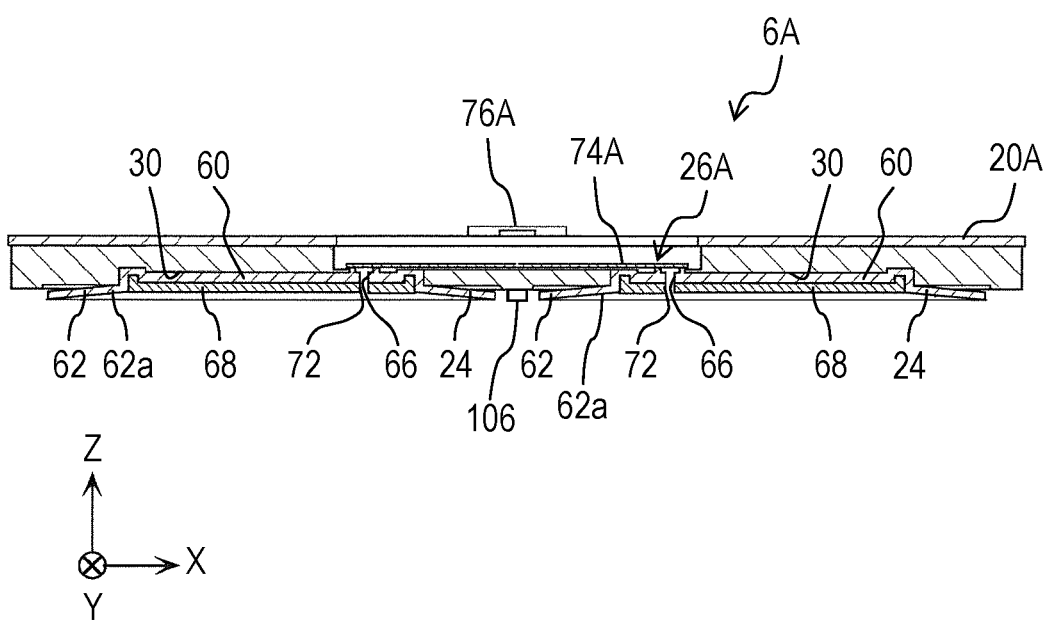
FIG. 16 is a sectional view schematically showing an example of the internal structure of the stand according to the second exemplary embodiment.

FIG. 16 is a sectional view schematically showing an example of the internal structure of stand 6A according to the second exemplary embodiment. FIG. 16 is a sectional view taken along XVI-XVI in FIG. 13.

A configuration of stand 6A according to the second exemplary embodiment is similar to a configuration of stand 6 according to the first exemplary embodiment, and hence a detailed description of the configuration will be omitted. Note, however, that stand 6A according to the second exemplary embodiment mainly differs from stand 6 according to the first exemplary embodiment in the following points. The main differences between stand 6A according to the second exemplary embodiment and stand 6 according to the first exemplary embodiment are following two points: a) stand 6A is provided with a plurality of (two in a case exemplified by this exemplary embodiment) elastic bodies 24 and b) operation member 76A is disposed on base portion 20A. The second exemplary embodiment will be described below, with emphasis on these differences.

As shown in FIGS. 12 and 15, base portion 20A is formed into a substantially rectangular box shape in planar view (when viewed from the Z-axis direction). Opening portion 104 is formed in an upper surface (a surface on the positive Z-axis direction side) of base portion 20A so as to make an upper end portion (an end portion on the positive Z-axis direction side) of operation member 76A protrude outside of an upper surface side (the positive Z-axis direction side) of base portion 20A. As shown in FIGS. 13 and 15, opening portion 108 is formed in a lower surface (a surface on the negative Z-axis direction side) of base portion 20A so as to make a lower end portion (an end portion on the negative Z-axis direction side) of holding member 106 (to be described later) protrude outside of a lower surface side (negative Z-axis direction side) of base portion 20A. As shown in FIG. 16, a plurality of recess portions 30 for respectively accommodating the plurality of elastic bodies 24 are formed in the lower surface of base portion 20A. As shown in FIG. 13, the plurality of elastic bodies 24 are arranged in a longitudinal direction (X-axis direction) of base portion 20A.

Note that in this exemplary embodiment, as in the first exemplary embodiment, a support portion (not shown) may be provided upright on the upper surface of base portion 20A, and a device main body (not shown) may be supported by the support portion. However, because stand 6A according to this exemplary embodiment has operation member 76A placed on base portion 20A, a support portion can be omitted. That is, a support portion may be omitted, and the device main body may be directly supported on the upper surface of base portion 20A.

As shown in FIGS. 14 and 15, valve mechanism 26A includes ventilation holes 66 each of which is provided in each of the plurality of elastic bodies 24, on-off valve 74A, operation member 76A, biasing member 78A, and holding member 106.

As shown in FIG. 14, on-off valve 74A is formed into a substantially trapezoidal plate shape in planar view (when viewed from the positive Z-axis direction) and is placed inside base portion 20A. In addition, hole 74d having a substantially circular shape in planar view is formed near a center of on-off valve 74A. On the other hand, as shown in FIG. 15, substantially columnar shaft portion 110 protruding in the positive Z-axis direction is formed at a position inside base portion 20A which corresponds to hole 74d. Hole 74d is formed to have a larger diameter than shaft portion 110, and shaft portion 110 extends through hole 74d. On-off valve 74A is disposed so as to be movable (tillable), centered on shaft portion 110 formed inside base portion 20A, between a close position (see FIGS. 17 and 19) at which ventilation holes 66 of the plurality of elastic bodies 24 are closed and an open position (see FIG. 18) at which ventilation holes 66 of the plurality of elastic bodies 24 are opened. On-off valve 74A takes a horizontal posture (a posture substantially parallel to an X-Y plane) at the close position (see FIG. 17) and a posture (inclined posture) inclined relative to a horizontal plane (X-Y plane) at the open position (see FIG. 18).

As shown in FIGS. 14 and 15, protruding piece 112 is formed on one end portion (an end portion on the positive Y-axis direction side) of on-off valve 74A so as to extend toward holding member 106 (in the positive Y-axis direction).

As shown in FIG. 15, operation member 76A is bent, from one end portion of on-off valve 74A which is located on the positive Y-axis direction, once in a substantially L shape on the positive Z-axis direction side in lateral view (when viewed from the X-axis direction), and a portion of operation member 76A which protrudes outward from opening portion 104 formed on the upper surface of base portion 20A is further bent in a substantially L shape toward the positive Y-axis direction so as to extend in the positive Y-axis direction. Accordingly, as shown in FIGS. 12 and 15, an upper end portion (an end portion on the positive Z-axis direction side) of operation member 76A protrudes outside on an upper side (on the positive Z-axis direction) of base portion 20A through opening portion 104. This allows the user to manually operate operation member 76A. Stand 6A is configured to allow the user to move (tilt) on-off valve 74A from the close position to the open position by pushing operation member 76A downward (in the negative Z-axis direction) with his/her finger and the like. Note that this exemplary embodiment will exemplify a configuration in which operation member 76A is formed from, for example, a resin or metal integrally with on-off valve 74A. However, operation member 76A and on-off valve 74A may be discretely formed.

Biasing member 78A is a member that biases on-off valve 74A toward the close position, and is formed from, for example, a coil spring. As shown in FIG. 15, biasing member 78A is placed on an outer peripheral portion of shaft portion 110, inside base portion 20A, such that one end portion comes into contact with the upper surface of base portion 20A, and the other end portion comes into contact with the upper surface of on-off valve 74A. Biasing member 78A exerts a biasing force on the upper surface of on-off valve 74A downward (in the negative Z-axis direction). This presses on-off valve 74A toward the close position. On-off valve 74A located at the close position can close ventilation hole 66.

Holding member 106 is a member for holding on-off valve 74A at the close position or the open position. As shown in FIGS. 14 and 15, holding member 106 is placed at a position to face protruding piece 112 of on-off valve 74A (to face in the Y-axis direction) inside base portion 20A, and is formed into a substantially L shape protruding downward (in the negative Z-axis direction) in lateral view (when viewed from the X-axis direction). A lower end portion (an end portion on the negative Z-axis direction side) of holding member 106 protrudes outside of a lower side (a negative Z-axis direction side) of base portion 20A through opening portion 108 formed in a lower surface (a surface on the negative Z-axis direction side) of base portion 20A. As shown in FIG. 15, holding member 106 is formed such that the lower end portion of holding member 106 is in contact with sucked surface 16a while base portion 20A is placed on sucked surface 16a. One end portion (an end portion on the negative Y-axis direction side) of holding member 106 is provided with inclined surface 116 with which protruding piece 112 of on-off valve 74A slidably comes into contact. Inclined surface 116 is formed such that, relative to one end portion on the negative Z-axis direction side, the other end portion on the positive Z-axis direction side is located on the positive Y-axis direction side.

Holding member 106 is supported inside base portion 20A through a pair of leaf springs 114. The pair of leaf springs 114 are members that exert biasing forces on holding member 106 in the negative Y-axis direction. Holding member 106 is supported so as to be tiltable about the pair of leaf springs 114 between a first posture (see FIGS. 17 and 18) in which holding member 106 moves in the horizontal direction (Y-axis direction) and a second posture (see FIG. 19) in which holding member 106 tilts downward (in the negative Z-axis direction) relative to the horizontal direction. While base portion 20A is placed on sucked surface 16a, holding member 106 is held in the first posture as the lower end portion of holding member 106 in contact with sucked surface 16a (see FIGS. 15, 17, and 18). When base portion 20A is lifted from sucked surface 16a, a lower end portion (an end portion on the negative Z-axis direction side) of holding member 106 is separated from sucked surface 16a, so that holding member 106 tilts by its own weight from the first posture to the second posture (see FIG. 19).

Figure 18:
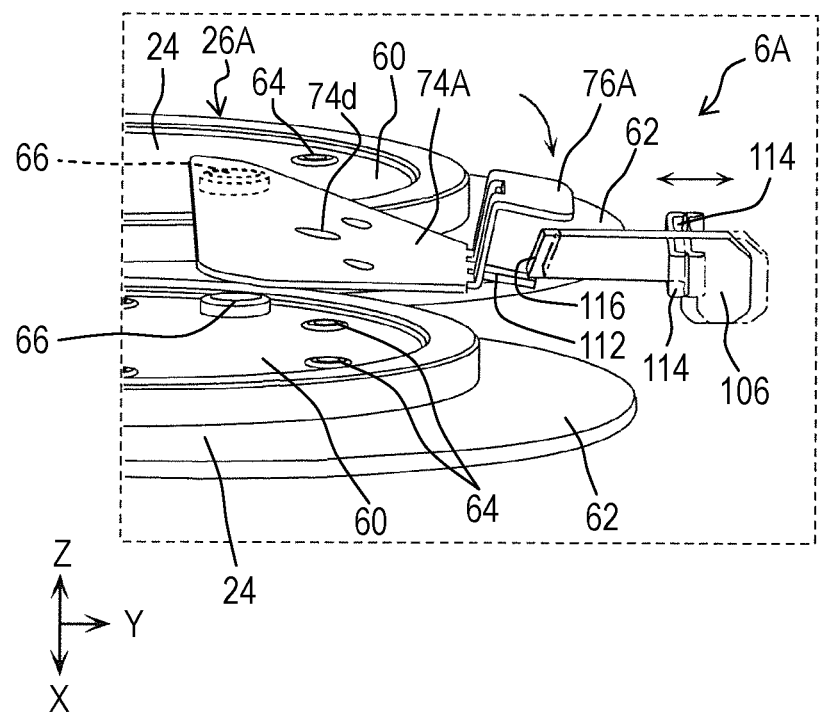
FIG. 18 is a view for describing an operation of the stand according to the second exemplary embodiment.

In the first posture in which holding member 106 is held in a horizontal posture, holding member 106 can move in the horizontal direction (Y-axis direction) between a third position at which holding member 106 is located closest to on-off valve 74A (a farthest position on the negative Y-axis direction side, which is indicated by a solid line in FIG. 18) and a fourth position farthest from on-off valve 74A (a farthest position on the positive Y-axis direction side, which is indicated by a chain line in FIG. 18). Holding member 106 at the fourth position is biased from the fourth position to the third position (in the negative Y-axis direction) by the pair of leaf springs 114 that press holding member 106 in the negative Y-axis direction.

[2-2. Operation of Stand]

An operation of stand 6A will be described next with reference to FIGS. 17 to 19.

Figure 17:
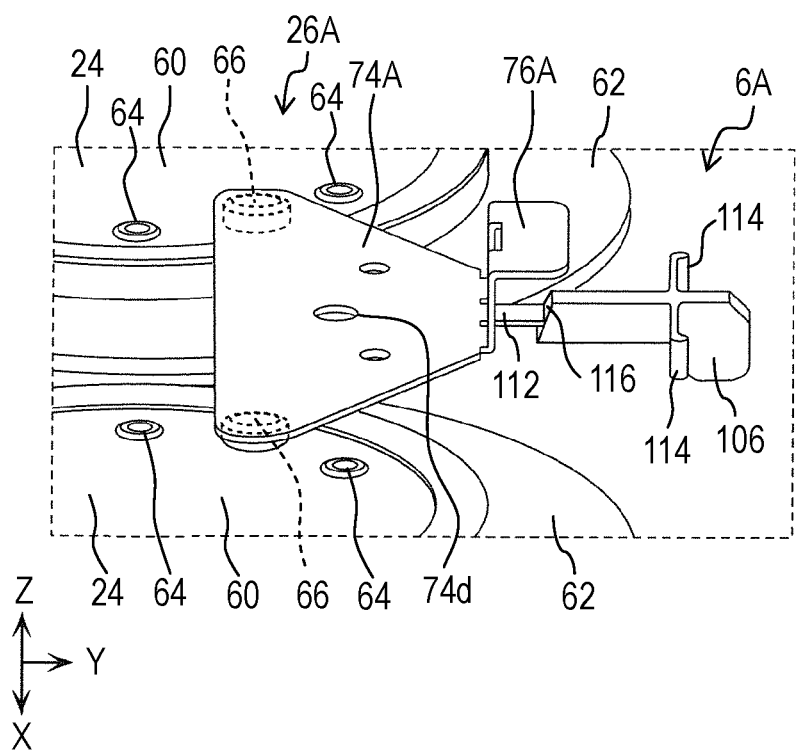
FIG. 17 is a view for describing an operation of the stand according to the second exemplary embodiment.

FIGS. 17 to 19 are views for describing an operation of stand 6A according to the second exemplary embodiment.

FIG. 17 shows a state in which base portion 20 of stand 6A is placed on sucked surface 16a (not shown in FIGS. 17 to 19) of a mount table. At this time, holding member 106 is held in the first posture and located at the third position as a lower end portion (an end portion on the negative Z-axis direction side) of holding member 106 comes into contact with sucked surface 16a. Protruding piece 112 of on-off valve 74A is in contact with inclined surface 116 of holding member 106. In this state, on-off valve 74A is held at the close position.

When a user pushes operation member 76A downward (in the negative Z-axis direction) with a finger (not shown) as shown in FIG. 18 to lift stand 6A from the mount table, on-off valve 74A moves (tilts) from the close position to the open position. As a state of ventilation hole 66 changes from a closed state to an open state, stand 6A is ready to be lifted from the mount table as in the first exemplary embodiment.

At this time, protruding piece 112 of on-off valve 74A slides on inclined surface 116 of holding member 106 downward (in the negative Z-axis direction) to press holding member 106 in the positive Y-axis direction. This causes holding member 106 to move from the third position to the fourth position. When protruding piece 112 slides on inclined surface 116 of holding member 106 and moves to the lower side (negative Z-axis direction side) of one end portion (an end portion on the negative Z-axis direction side) of inclined surface 116, holding member 106 is released from a force that presses holding member 106 in the positive Y-axis direction. Subsequently, holding member 106 is biased in the negative Y-axis direction by an elastic restoring force of the pair of leaf springs 114 to move from the fourth position to the third position. As holding member 106 moves to the third position, one end portion of inclined surface 116 comes into contact with an upper surface (a surface on the positive Z-axis direction) of protruding piece 112 of on-off valve 74A. In this state, when the user stops pressing operation member 76A downward, a biasing force generated by an elastic restoring force of biasing member 78A is exerted upward (in the positive Z-axis direction) on protruding piece 112. However, because one end portion of inclined surface 116 is in contact with the upper surface of protruding piece 112, protruding piece 112 is hooked on inclined surface 116 from below (on the negative Z-axis direction) and held at the position. This holds on-off valve 74A at the open position. As described above, according to this exemplary embodiment, in a state that base portion 20 of stand 6A is placed on sucked surface 16a of the mount table, when the user presses operation member 76A downward (in the negative Z-axis direction) to move (tilt) on-off valve 74A from the close position to the open position, one end portion of holding member 106 acts on protruding piece 112 of on-off valve 74A. This holds on-off valve 74A at the open position even after the user stops pressing operation member 76A downward. This makes it unnecessary for the user to continue to press operation member 76A downward when lifting stand 6A from the mount table, thus improving convenience for the user.

When the user lifts stand 6A from sucked surface 16a of the mount table in the state shown in FIG. 18, a lower end portion (an end portion on the negative Z-axis direction) of holding member 106, which comes into contact with sucked surface 16a, is separated from sucked surface 16a. As a consequence, holding member 106 is released from a force that keeps holding member 106 in the first posture. This makes holding member 106 ready to tilt from the first posture to the second posture. Holding member 106 then tilts by its own weight from the first posture to the second posture. At this time, protruding piece 112 is released from one end portion of inclined surface 116 that is in contact with the upper surface of protruding piece 112 to hold protruding piece 112 at a lower position (a position on the negative Z-axis direction side) shown in FIG. 8, and becomes ready to move upward (in the positive Z-axis direction). The elastic restoring force of biasing member 78A causes protruding piece 112 to move upward (in the positive Z-axis direction). This causes on-off valve 74A to move (tilt) from the open position to the close position. As described above, in this exemplary embodiment, when the user lifts stand 6A from sucked surface 16a of the mount table, on-off valve 74A is automatically released from a state in which on-off valve 74A is held at the open position by holding member 106. On-off valve 74A then moves (tilts) from the open position to the close position in interlocking with movement of holding member 106 from the first posture to the second posture.

Subsequently, when the user lowers stand 6A to sucked surface 16a of the mount table again, a lower end portion (an end portion on the negative Z-axis direction side) of holding member 106 comes into contact with sucked surface 16a and is lifted upward (the positive Z-axis direction). Holding member 106 then tilts from the second posture to the first posture. This sets stand 6A in the state shown in FIG. 17 again to maintain the state in which ventilation hole 66 is closed by on-off valve 74A located at the close position.

[2-3. Effects and Like]

As described above, in the electronic device according to this exemplary embodiment, the valve mechanism may further include a holding member that is placed on the base portion and can tilt between the first posture and the second posture. The holding member may act on the on-off valve in the first posture to hold the on-off valve at the open position when the on-off valve moves from the close position to the open position while the stand is placed on the sucked surface, and release the held state of the on-off valve at the open state by tilting from the first posture to the second posture and separating from the on-off valve when the stand is lifted from the sucked surface.

Note that stand 6A is an example of a stand. Valve mechanism 26A is an example of a valve mechanism. Base portion 20A is an example of a base portion. Holding member 106 is an example of a holding member. On-off valve 74A is an example of an on-off valve.

For example, in stand 6A of the electronic device according to the second exemplary embodiment, valve mechanism 26A further includes holding member 106 that is placed on base portion 20A and can tilt between a first posture and a second posture. Holding member 106 acts on on-off valve 74A in the first posture to hold on-off valve 74A at the open position when on-off valve 74A moves from the close position to the open position while stand 6A is placed on sucked surface 16a. Holding member 106 releases the held state of on-off valve 74A at the open state by tilting from the first posture to the second posture and separating from on-off valve 74A when stand 6A is lifted from sucked surface 16a.

Stand 6A having this configuration can automatically release the held state of on-off valve 74A at the open position by holding member 106 when the user lifts stand 6A from sucked surface 16a. This can improve convenience for the user who uses stand 6A.

This electronic device may be provided with a plurality of elastic bodies. The on-off valve may open each ventilation hole of the plurality of elastic bodies at the open position, and close each ventilation hole of the plurality of elastic bodies at the close position.

For example, stand 6A of the electronic device according to the second exemplary embodiment is provided with a plurality of elastic bodies 24. On-off valve 74A opens each ventilation hole 66 of the plurality of elastic bodies 24 at the open position, and closes ventilation hole 66 of each elastic bodies 24 at the close position.

Stand 6A having this configuration is provided with the plurality of elastic bodies 24, and hence can further increase suction force between the plurality of elastic bodies 24 and sucked surface 16a. This makes it possible to effectively suppress falling down of an electronic device even if, for example, the device main body is relatively large in size.

Other Exemplary Embodiments

The first and second exemplary embodiments have been described above as an example of the technique disclosed in the present application. However, the technique in the present disclosure is not limited to the first and second exemplary embodiments, and is also applicable to exemplary embodiments having undergone alterations, substitutions, additions, omissions, or the like. In addition, new exemplary embodiments can be made by combining constituent elements described in the first and second exemplary embodiments.

Accordingly, other exemplary embodiments will be described below.

Although the first and second exemplary embodiments have exemplified the configuration including the liquid crystal television receiver as device main body 4, the present disclosure is not limited to this configuration. Device main body 4 may be one of various display devices such as a liquid crystal display or electro luminescence (EL) display for a personal computer. Alternatively, device main body 4 may be one of various devices such as a speaker, electric fan, or illumination device (for example, a desk lamp). Device main body 4 according to the present disclosure may at least be a device that is supported by stand 6 (6A).

The first and second exemplary embodiments have exemplified the configuration in which elastic body 24 and attaching portion 60 each have a circular shape in planar view (when viewed from the Z-axis direction). However, the present disclosure is not limited to this configuration. Elastic body 24 or attaching portion 60 may have a shape in planar view other than a circle, such as a rectangle, polygon, triangle, trapezoid, or ellipse.

The first and second exemplary embodiments have the configuration in which stand 6 (GA) is provided with biasing member 78 (78A) that biases on-off valve 74 (74A) in the direction from the open position to the close position. However, the present disclosure is not limited to this configuration. Stand 6 (GA) may have a configuration from which biasing member 78 (78A) is omitted. In this case, for example, on-off valve 74 (74A) may be configured to move by its own weight from the open position to the close position.

The first exemplary embodiment has exemplified the configuration in which stand 6 is provided with one elastic body 24. However, the present disclosure is not limited to this configuration. Like stand 6A according to the second exemplary embodiment, stand 6 may be provided with a plurality of elastic bodies 24.

The second exemplary embodiment has exemplified the configuration in which stand 6A is provided with a plurality of (for example, two) elastic bodies 24. However, the present disclosure is not limited to this configuration. Like stand 6 according to the first exemplary embodiment, stand 6A may be provided with one elastic body 24.

The first and second exemplary embodiments have exemplified the configuration in which base portion 20 (20A) has a substantially rectangular shape in planar view (when viewed from the Z-axis direction). However, the present disclosure is not limited to this configuration. Base portion 20 (20A) may have a shape in planar view other than a rectangle, such as a circle, ellipse, triangle, trapezoid, or polygon.

The first and second exemplary embodiments have exemplified the configuration in which recess portion 30 of base portion 20 (20A) has a circular shape in planar view (when viewed from the Z-axis direction). However, the present disclosure is not limited to this configuration. Recess portion 30 may have a shape in planar view other than a circle, such as a rectangle, ellipse, triangle, trapezoid, or polygon. Recess portion 30 may at least have a shape that can accommodate attaching portion 60 of elastic body 24.

The first and second exemplary embodiments have exemplified the configuration in which pressing member 68 has a circular shape in planar view (when viewed from the Z-axis direction). However, the present disclosure is not limited to this configuration. Pressing member 68 may have a shape in planar view other than a circle, such as a rectangle, ellipse, triangle, trapezoid, or polygon. Pressing member 68 may at least have a shape that can press attaching portion 60 on recess portion 30 of base portion 20 (20A).

The first and second exemplary embodiments have exemplified the configuration in which compression portion 71 and press-fitting portions 73 are formed on pressing member 68. However, the present disclosure is not limited to this configuration. Only one of compression portion 71 and press-fitting portions 73 may be formed on pressing member 68.

The first and second exemplary embodiments have exemplified the configuration in which screws 32 are screwed into base portion 20 (20A) through holes 70 formed in pressing member 68 and holes 64 formed in elastic body 24 to fix pressing member 68 and elastic body 24 to base portion 20 (20A). However, the present disclosure is not limited to this configuration. Nails, pins, or the like may be used instead of screws 32.

The first and second exemplary embodiments have exemplified silicon, urethane, and rubber as materials forming elastic body 24. However, materials forming elastic body 24 are not limited to these materials. Materials forming elastic body 24 may at least be elastic materials functioning as suction cups (for example, materials that can be attached by suction to sucked surface 16a).

The exemplary embodiments have exemplified the configuration in which no negative pressure is generated in gap 102 when no external force is exerted on stand 6 (6A) in a direction to separate from sucked surface 16a (that is, in the state shown in part (a) of FIG. 11), whereas negative pressure is generated in gap 102 when an external force is exerted on stand 6 (6A) in the direction to separate from sucked surface 16a. However, the present disclosure is not limited to this configuration. For example, when no external force is exerted on stand 6 (6A) in a direction to separate from sucked surface 16a, weak negative pressure may be generated in gap 102 to an extent that substantially no degradation occurs in elastic body 24. When an external force is exerted on stand 6 (GA) in a direction to separate from sucked surface 16a, stronger negative pressure may be generated in gap 102. That is, according to the present disclosure, even if weak negative pressure is generated in gap 102 when no external force is exerted on stand 6 (GA) in a direction to separate from sucked surface 16a, it is possible to regard that no negative pressure is generated as long as the negative pressure is weak enough to cause substantially no degradation in elastic body 24.

The above exemplary embodiments have been described as examples of the technique in the present disclosure. For this purpose, the accompanying drawings and the detailed description have been provided.

For illustration of the above technique, the constituent elements illustrated and described in the accompanying drawings and the detailed description may include not only the constituent elements that are essential for solving the problem but also constituent elements that are not essential for solving the problem. These non-essential constituent elements therefore should not be instantly construed as being essential, based on the fact that the non-essential constituent elements are illustrated and described in the accompanying drawings and the detailed description.

Further, the foregoing exemplary embodiments are provided to exemplify the technique in the present disclosure, and thus various alterations, substitutions, additions, omissions, and the like can be made within the scope of the claims or equivalents of the claims.

INDUSTRIAL APPLICABILITY

The present disclosure can be applied to an electronic device including a stand. Specifically, the present disclosure can be applied to a display device such as a liquid crystal television receiver.

REFERENCE MARKS IN THE DRAWINGS

2: electronic device
4: device main body
6, 6A: stand
8: liquid crystal display panel
8a: display screen
10: housing
12: front cabinet
14: rear cabinet
16: mount table
16a: sucked surface
18, 32, 38, 42, 44: screw
20, 20A: base portion
22: support portion
24: elastic body
26, 26A: valve mechanism
28: leg portion
30: recess portion
34: screw hole
36: through hole
40: support cover
46, 48, 64, 70: hole
50: handle
52, 104, 108: opening portion
54: hook portion
56: fixing belt
58: buckle
60: attaching portion
62: suction portion
62a: suction surface
66, 72: ventilation hole
68: pressing member
71: compression portion
73: press-fitting portion
74, 74A: on-off valve
74b: pin
74c: groove
74d: hole
76, 76A: operation member
78, 78A: biasing member
80: releasing member
81: coil spring
82: connecting portion
82a: connecting region
84: grip portion
86: guide mechanism
88, 98: groove portion
90, 100: protruding portion
92: hand
94, 110: shaft portion
96: interlocking mechanism
102: gap
106: holding member
112: protruding piece
114: leaf spring
116: inclined surface

The invention claimed is:

1. An electronic device comprising:
a device main body; and
a stand that is placed on a placement surface and supports the device main body, wherein:
the stand includes
a base portion, and
an elastic body that is disposed on a lower surface of the base portion and has a suction surface that is attached by suction to the placement surface by a negative pressure that is generated in a gap between the suction surface and the placement surface, and
the elastic body
maintains an air pressure in the gap equal to a surrounding air pressure when no external force is exerted on the stand in a direction to separate the stand from the placement surface while the stand is placed on the placement surface, and
generates the negative pressure in the gap when the elastic body is elastically deformed in the direction to separate the stand from the placement surface when the external force is exerted on the stand while the stand is placed on the placement surface.

2. The electronic device according to claim 1, wherein the elastic body is formed into a sheet shape.

3. The electronic device according to claim 2, wherein the suction surface is formed into a ring shape.

4. The electronic device according to claim 1, further comprising a valve mechanism configured to switch between letting air flow into the gap and shutting off air, wherein the valve mechanism includes
a ventilation hole formed in the elastic body and communicating with the gap,
an on-off valve placed on the base portion and configured to move between an open position to open the ventilation hole and a close position to close the ventilation hole, and
an operation member configured to move the on-off valve between the open position and the close position.

5. The electronic device according to claim 4, wherein the valve mechanism further includes a biasing member configured to bias the on-off valve toward the close position.

6. The electronic device according to claim 4, further comprising a handle configured to lift the electronic device, wherein the operation member includes
a grip portion grippably disposed on the handle, and
a connecting portion configured to connect the grip portion to the on-off valve and move between a first position and a second position,
the connecting portion locates the on-off valve at the close position when the connecting portion is located at the first position, and locates the on-off valve at the open position when the connecting portion is located at the second position.

7. The electronic device according to claim 6, further comprising a hook portion configured to detachably engage a fixing belt for fixing the electronic device, wherein
the valve mechanism further includes a releasing member configured to act on the fixing belt to release engagement between the fixing belt and the hook portion in interlocking with movement of the connecting portion from the first position to the second position.

8. The electronic device according to claim 4, wherein the valve mechanism further includes a holding member placed on the base portion and configured to tilt between a first posture and a second posture, and
the holding member holds the on-off valve at the open position by acting on the on-off valve in the first posture when the on-off valve moves from the close position to the open position while the stand is placed on the placement surface, and releases holding of the on-off valve at the open position by tilting from the first posture to the second posture and separating from the on-off valve when the stand is lifted from the placement surface.

9. The electronic device according to claim 4, wherein a plurality of the elastic bodies are provided, and the on-off valve opens the ventilation hole of each of the plurality of elastic bodies at the open position, and closes the ventilation hole of each of the plurality of elastic bodies at the close position.

10. The electronic device according to claim 1, further comprising a pressing member coupled to a lower surface of the elastic body and configured to press the elastic body on the base portion.

11. The electronic device according to claim 10, further comprising:
a first hole formed in the pressing member;
a second hole formed in the elastic body; and
a fixing member configured to fix the pressing member and the elastic body to the base portion by being screwed into the base portion through the first hole and the second hole,
wherein the pressing member includes a press-fitting portion formed on an outer peripheral portion of the first hole and press-fitted into the second hole.

12. The electronic device according to claim 11, wherein the pressing member further includes a compression portion formed on the outer peripheral portion of the first hole and configured to compress an outer peripheral portion of the second hole of the elastic body toward the base portion.

13. A stand that is placed on a placement surface and supports a device main body, the stand comprising:
a base portion; and
an elastic body that is placed on a lower surface of the base portion and has a suction surface that is attached by suction to the placement surface by a negative pressure that is generated in a gap between the suction surface and the placement surface,
wherein the elastic body
maintains an air pressure in the gap equal to a surrounding air pressure when no external force is exerted on the stand in a direction to separate the stand from the placement surface while the stand is placed on the placement surface, and
generates the negative pressure in the gap when the elastic body is elastically deformed in the direction to separate the stand from the placement surface when the external force is exerted on the stand while the stand is placed on the placement surface.

* * * * *